United States Patent
Tsukamoto et al.

(10) Patent No.: US 10,276,819 B2
(45) Date of Patent: Apr. 30, 2019

(54) ORGANIC ELECTROLUMINESCENT ELEMENT, MANUFACTURING METHOD FOR SAME, AND LIGHT EMISSION METHOD INCLUDING A THERMALLY ACTIVATED DELAYED FLUORESCENT MATERIAL

(71) Applicant: Sharp Kabushiki Kaisha, Sakai, Osaka (JP)

(72) Inventors: Yuto Tsukamoto, Sakai (JP); Katsuhiro Kikuchi, Sakai (JP); Hideki Uchida, Sakai (JP); Eiji Koike, Sakai (JP); Satoshi Inoue, Sakai (JP); Masanori Ohara, Sakai (JP); Kazuki Matsunaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/504,674

(22) PCT Filed: Aug. 17, 2015

(86) PCT No.: PCT/JP2015/073005
§ 371 (c)(1),
(2) Date: Feb. 17, 2017

(87) PCT Pub. No.: WO2016/027760
PCT Pub. Date: Feb. 25, 2016

(65) Prior Publication Data
US 2017/0256733 A1 Sep. 7, 2017

(30) Foreign Application Priority Data
Aug. 22, 2014 (JP) ................. 2014-169927

(51) Int. Cl.
*H01L 29/08* (2006.01)
*H01L 51/50* (2006.01)
(Continued)

(52) U.S. Cl.
CPC .......... *H01L 51/5016* (2013.01); *C09K 11/06* (2013.01); *H01L 51/0067* (2013.01);
(Continued)

(58) Field of Classification Search
CPC .................. H01L 51/5016; H01L 51/0067
(Continued)

(56) References Cited

U.S. PATENT DOCUMENTS

2013/0292656 A1  11/2013  Seo et al.
2014/0034930 A1   2/2014  Seo et al.
(Continued)

FOREIGN PATENT DOCUMENTS

JP  2014-22666 A  2/2014
JP  2014-45179 A  3/2014
(Continued)

OTHER PUBLICATIONS

Takahashi et al., "Donor-acceptor-structured 1, 4-diazatriphenylene derivatives exhibiting thermally activated delayed fluorescence: design and synthesis, photophysical properties and OLED characteristics", Science and Technology of Advanced Materials 15, May 27, 2014, 11 pages.
(Continued)

*Primary Examiner* — Caleb E Henry
(74) *Attorney, Agent, or Firm* — Keating & Bennett, LLP

(57) ABSTRACT

The organic EL element (10) at least includes, between a first electrode (2) and a second electrode (4), at least one layer of an exciton generating layer (33) which contains at least one type of TADF material as a host material and at
(Continued)

least one layer of a fluorescent emission layer (34) which contains at least one type of fluorescent emission material.

18 Claims, 8 Drawing Sheets

(51) Int. Cl.
  *H01L 51/00* (2006.01)
  *H01L 51/56* (2006.01)
  *C09K 11/06* (2006.01)
(52) U.S. Cl.
  CPC .......... *H01L 51/50* (2013.01); *H01L 51/5004* (2013.01); *H01L 51/5012* (2013.01); *H01L 51/56* (2013.01)
(58) Field of Classification Search
  USPC .......................................................... 257/40
  See application file for complete search history.

(56) References Cited

U.S. PATENT DOCUMENTS

| 2014/0061604 A1* | 3/2014 | Seo ........................ C09K 11/06 257/40 |
| 2015/0188070 A1 | 7/2015 | Ogiwara et al. |
| 2016/0141516 A1 | 5/2016 | Numata et al. |

FOREIGN PATENT DOCUMENTS

| KR | 10-2013-0116185 A | 10/2013 |
| WO | 2015/002213 A1 | 1/2015 |
| WO | 2015/041157 A1 | 3/2015 |

OTHER PUBLICATIONS

Official Communication issued in International Patent Application No. PCT/JP2015/073005, dated Nov. 2, 2015.

\* cited by examiner

ORGANIC ELECTROLUMINESCENT ELEMENT, MANUFACTURING METHOD FOR SAME, AND LIGHT EMISSION METHOD INCLUDING A THERMALLY ACTIVATED DELAYED FLUORESCENT MATERIAL

TECHNICAL FIELD

The present invention relates to an organic electroluminescent element, a method for manufacturing the organic electroluminescent element, and a light emission method.

BACKGROUND ART

In recent years, a self-light-emissive display device in which organic electroluminescence (hereinafter, referred to as "organic EL") is used has been developed as a display device that can substitute for a liquid crystal display device.

An organic EL element can emit light with a voltage of approximately several volts to several tens of volts. The organic EL element is self-light-emissive and is therefore wide in viewing angle and high in viewability. Further, the organic EL element is a perfect solid element in a form of thin film, and therefore attracts attentions from the viewpoint of space saving, portability, and the like.

The organic EL element has a configuration in which a luminescent layer containing a luminescent material made of an organic compound is sandwiched between a cathode and an anode. The organic EL element emits light by utilizing a mechanism in which electrons and positive holes (holes) are introduced into the luminescent layer, the electrons and positive holes are caused to recombine so that excitons are generated thereby, and light is emitted when the excitons lose their activity.

The luminescent material is excited when organic molecules in a ground state (S0) absorb light energy and molecules at a highest occupied molecular orbital (HOMO) level are shifted to a lowest unoccupied molecular orbital (LUMO) level.

The organic molecule has two excitation states which are different in spin multiplicity, i.e., a singlet excitation state (S1) in which spin directions of the HOMO and the LUMO are parallel, and a triplet excitation state (T1) in which spin directions of the HOMO and the LUMO are antiparallel.

(a) of FIG. 11 is an explanatory view illustrating an exciton generation state of an ordinary luminescent material, and (b) of FIG. 11 is an explanatory view schematically illustrating an exciton generation state of a thermally activated delayed luminescent (thermally activated delayed fluorescent (TADF)) material which will be described later.

In general, the luminescent layer is constituted by a two-component system including (i) a host material which contributes to transfer of positive holes and electrons and (ii) a light emission dopant (guest) material which contributes to light emission. The light emission dopant is uniformly dispersed in the host material which is a main component.

As illustrated in (a) of FIG. 11, in an ordinary process of generating excitons in an organic EL element in which a luminescent material is used as a dopant, a singlet exciton which is an exciton in a singlet excitation state is generated at a probability of only 25%. At the remaining probability of 75%, a triplet exciton which is an exciton in a triplet excitation state is generated.

However, transition from the singlet excitation state to the ground state is transition between states having identical spin multiplicities, whereas transition from the triplet excitation state to the ground state is transition between states having different spin multiplicities.

Therefore, the transition from the triplet excitation state to the ground state is forbidden transition which requires a long time. As a result, the triplet exciton does not lose its activity for light emission but loses its activity for heat by changing into heat energy or the like, and thus does not contribute to light emission.

From this, although a conventional fluorescent emission material (hereinafter, sometimes simply referred to as "fluorescent material") has many advantages such as an excellent high electric current density characteristic and variety in material selection, only 25% of the singlet exciton can be used in light emission.

Under the circumstances, in recent years, a thermally activated delayed luminescent (TADF) material has been developed in which a difference between energy in the singlet excitation state (excited singlet level: hereinafter referred to as "S1 level") and energy in the triplet excitation state (excited triplet level: hereinafter referred to as "T1 level") is extremely small. As illustrated in (b) of FIG. 11, studies are carried on for causing the triplet exciton to contribute to light emission by restoring the triplet exciton into the singlet exciton.

The development of the TADF material is carried on from both viewpoints of a TADF material used as a host material (TADF host material) and a TADF material used as a dopant (TADF dopant material). However transition (energy transfer) from an S1 level of the TADF host to an S1 level of the TADF dopant does not necessarily occur. For causing such transition, an energy relation between the S1 level of the TADF host material and the S1 level of the TADF dopant material is important. However, it is difficult to find a combination of TADF materials which have good compatibility.

On the other hand, there are many kinds of non-TADF materials. Therefore, the development can be made easy by utilizing a combination of a TADF material and a non-TADF material such as a combination of a TADF host material and an ordinary fluorescent material, and a combination of an ordinary host material (non-TADF host material) and a TADF dopant.

From this, so far, an organic EL element in which a TADF material and a non-TADF material are combined has been mainly developed. Each of Patent Literatures 1 and 2 discloses an organic EL element in which a luminescent layer contains a TADF material and a non-TADF material. The following description will discuss Patent Literature 1 as an example.

The organic EL element disclosed in Patent Literature 1 at least includes a luminescent layer provided between a first electrode and a second electrode. The luminescent layer at least contains a fluorescent material which is a luminescent substance and a TADF material.

From a singlet excitation state of the TADF material, energy transfer to a singlet excitation state of the fluorescent material occurs. Moreover, energy transfer from a triplet excitation state of the TADF material to a singlet excitation state to the fluorescent material A occurs via inverse intersystem crossing to the singlet excitation state of the TADF material. From this, Patent Literature 1 describes that light emission efficiently occurs from the singlet excitation state of the fluorescent material.

CITATION LIST

Patent Literature

[Patent Literature 1]
Japanese Patent Application Publication Tokukai No. 2014-45179 (Publication date: Mar. 13, 2014)

[Patent Literature 2]
Japanese Patent Application Publication Tokukai No. 2014-22666 (Publication date: Feb. 3, 2014)

SUMMARY OF INVENTION

Technical Problem

FIG. 12 is an explanatory view schematically illustrating an exciton generation state in a mixed luminescent layer in which a TADF material and an ordinary fluorescent material (non-TADF material) are mixed as in Patent Literatures 1 and 2.

As illustrated in FIG. 12, in a case where the TADF material is mixed with the fluorescent material constituted by the non-TADF material, some degree of exciton is to be surely generated by the non-TADF material. In a case where an exciton is generated in the non-TADF material itself, a triplet exciton is generated in the non-TADF material at a T1 level and becomes a non-luminescent component. Therefore, the triplet exciton generated in the non-TADF material leads to decrease in light emission efficiency.

The present invention is accomplished in view of the problem, and its object is to provide an organic electroluminescent element, a manufacturing method of such an organic electroluminescent element, and a light emission method, with each of which light emission efficiency can be improved as compared with a conventional technique.

Solution to Problem

In order to attain the object, an organic electroluminescent element in accordance with an aspect of the present invention at least includes: at least one layer of an exciton generating layer containing at least one type of thermally activated delayed fluorescent material as a host material; and at least one layer of a fluorescent emission layer containing at least one type of fluorescent emission material, the exciton generating layer and the fluorescent emission layer being provided between an anode and a cathode.

Moreover, in order to attain the object, a method for manufacturing an organic electroluminescent element in accordance with an aspect of the present invention includes the step of: forming an organic layer between an anode and a cathode, the step of forming the organic layer including: forming an exciton generating layer which contains at least one type of thermally activated delayed fluorescent material as a host material, and forming a fluorescent emission layer which contains at least one type of fluorescent emission material.

Moreover, in order to attain the object, a light emission method in accordance with an aspect of the present invention is a method in which light emission is caused by transferring excitons, which have been generated in an exciton generating layer containing a thermally activated delayed fluorescent material, to a fluorescent emission material in a fluorescent emission layer by Forster transition, the fluorescent emission layer being provided separately from the exciton generating layer.

Advantageous Effects of Invention

According to an aspect of the present invention, energy transfer (Forster transition) from an excited singlet level of the thermally activated delayed fluorescent material to an excited singlet level of the fluorescent emission material occurs even in a case where the thermally activated delayed fluorescent material which is a host material contributing to transfer of positive holes and electrons does not directly contact with the fluorescent emission material contributing to light emission.

Therefore, by providing an exciton generating layer separately from the fluorescent emission layer as above described, it is possible to prevent the thermally activated delayed fluorescent material from being mixed with the fluorescent emission material in the same layer, and it is thus possible to provide the organic electroluminescent element with which light emission efficiency can be improved as compared with a conventional technique. Moreover, by transferring excitons generated in the exciton generating layer containing the thermally activated delayed fluorescent material, by Forster transition, to the fluorescent emission material of the fluorescent emission layer which is provided separately from the exciton generating layer, it is possible to provide the light emission method in which light emission efficiency is higher than that of a conventional technique.

Figure 2:
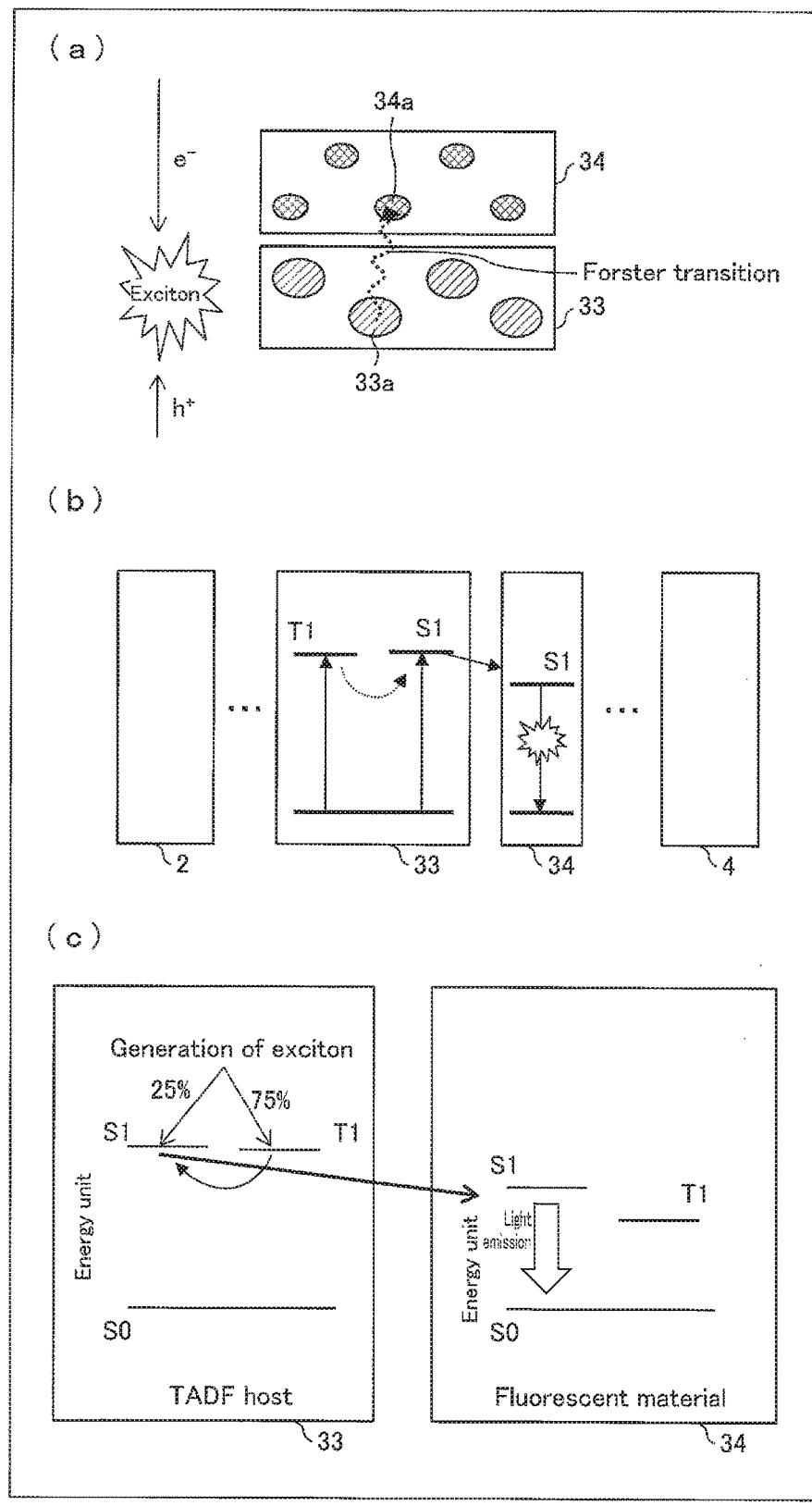

Each of (a) through (c) of FIG. 2 is an explanatory view schematically illustrating Forster transition between an exciton generating layer and a fluorescent emission layer in the organic EL element in accordance with Embodiment 1 of the present invention.

Figure 3:
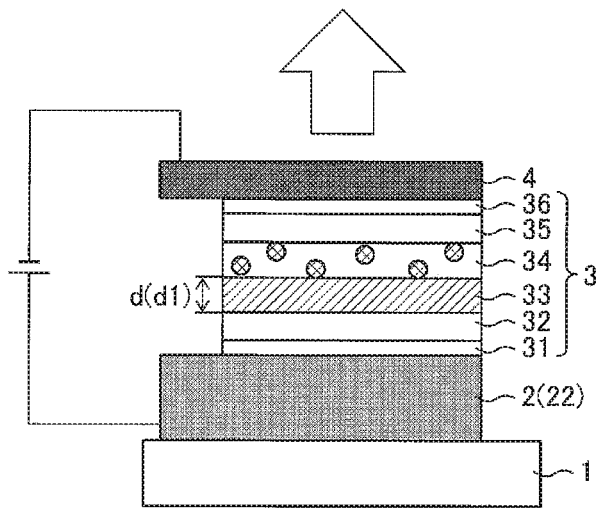

FIG. 3 is a cross-sectional view schematically illustrating a configuration of an organic EL element in accordance with Embodiment 2 of the present invention.

Figure 4:
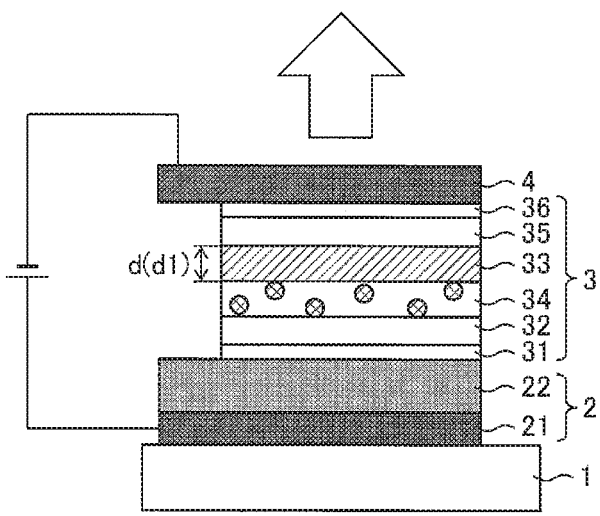

FIG. 4 is a cross-sectional view schematically illustrating a configuration of an organic EL element in accordance with Embodiment 3 of the present invention.

Figure 5:
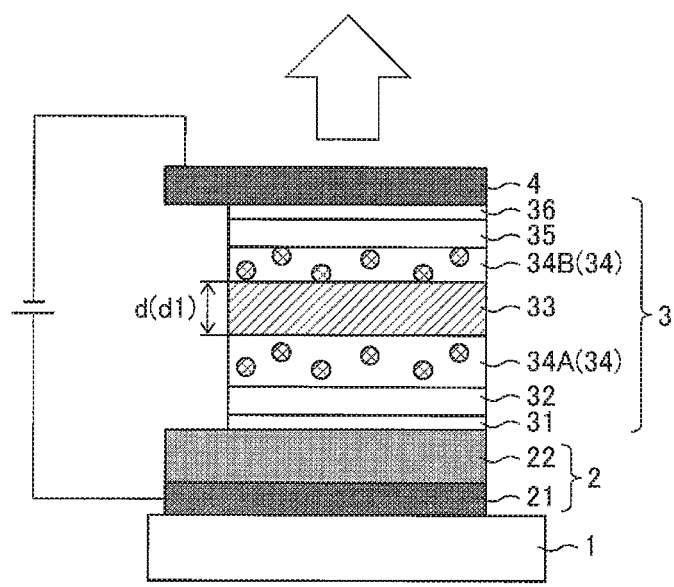

FIG. 5 is a cross-sectional view schematically illustrating a configuration of an organic EL element in accordance with Embodiment 4 of the present invention.

Figure 6:
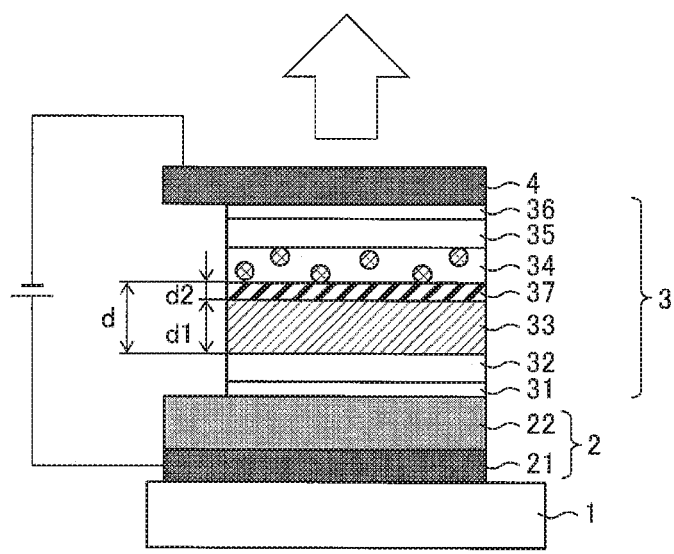

FIG. 6 is a cross-sectional view schematically illustrating a configuration of an organic EL element in accordance with Embodiment 5 of the present invention.

Figure 7:
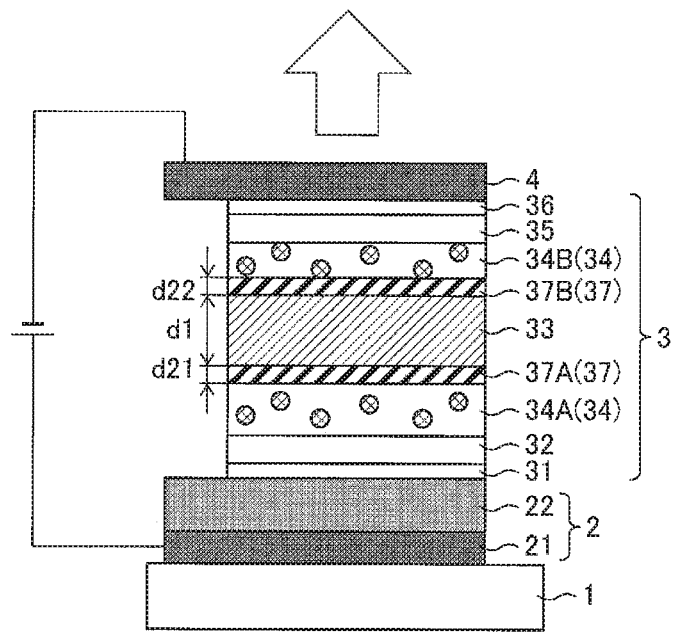

FIG. 7 is a cross-sectional view schematically illustrating a configuration of an organic EL element in accordance with Embodiment 6 of the present invention.

Figure 8:
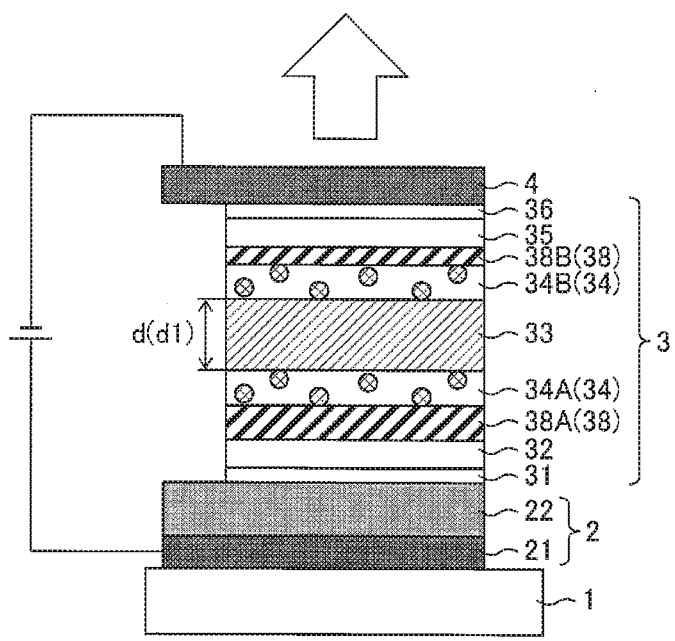

FIG. 8 is a cross-sectional view schematically illustrating a configuration of an organic EL element in accordance with Embodiment 7 of the present invention.

Figure 9:
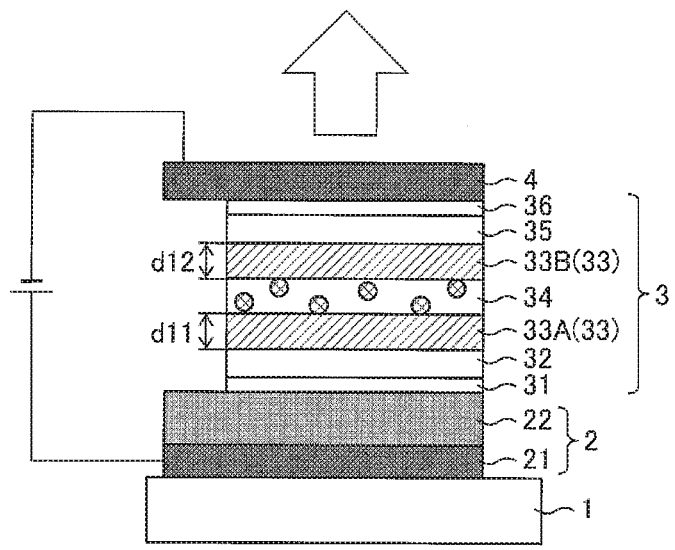

FIG. 9 is a cross-sectional view schematically illustrating a configuration of an organic EL element in accordance with Embodiment 8 of the present invention.

Figure 10:
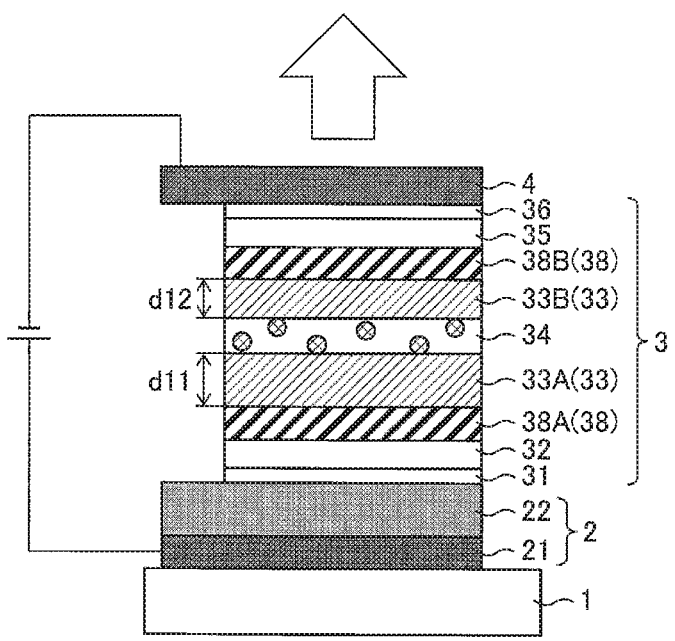

FIG. 10 is a cross-sectional view schematically illustrating a configuration of an organic EL element in accordance with Embodiment 9 of the present invention.

Figure 11:
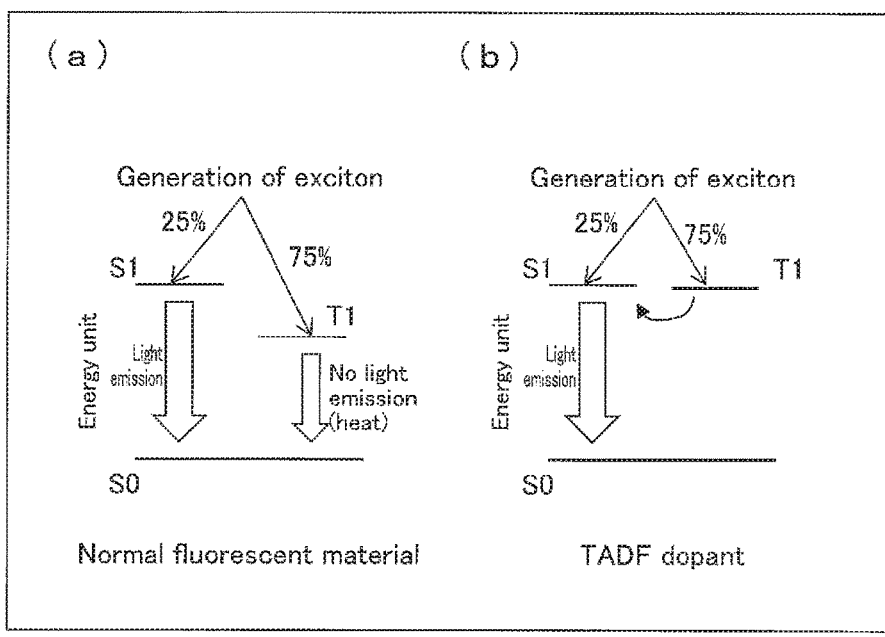

(a) of FIG. 11 is an explanatory view illustrating an exciton generation state of an ordinary luminescent material, and (b) of FIG. 11 is an explanatory view schematically illustrating an exciton generation state of a TADF material.

Figure 12:
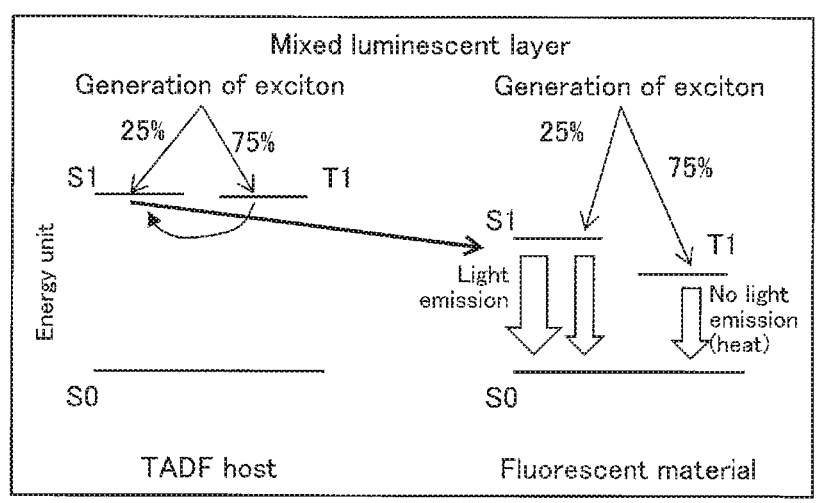

FIG. 12 is an explanatory view schematically illustrating an exciton generation state in a mixed luminescent layer in which a TADF material is mixed with an ordinary fluorescent material.

DESCRIPTION OF EMBODIMENTS

The following description will discuss embodiments of the present invention in detail.

Embodiment 1

Figure 1:
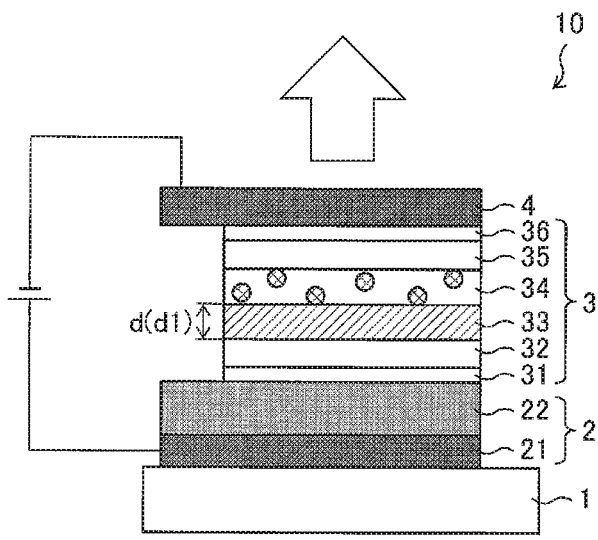
FIG. 1 is a cross-sectional view schematically illustrating a configuration of an organic EL element in accordance with Embodiment 1 of the present invention.

The following description will discuss an embodiment of the present invention with reference to FIG. 1 and (a) through (c) of FIG. 2.

<Schematic Configuration of Organic EL Element>

FIG. 1 is a cross-sectional view schematically illustrating a configuration of an organic EL element 10 in accordance with Embodiment 1.

In the organic EL element 10 in accordance with Embodiment 1, a first electrode 2, an organic EL layer 3 (organic layer), and a second electrode 4 are stacked in this order on a substrate 1 which serves as a base (see FIG. 1).

In Embodiment 1, a top emission type organic EL element 10 will be described as an example in which light emitted from a fluorescent emission layer 34 of the organic EL layer 3 is extracted from an opposite side of the substrate 1.

(Substrate 1)

The substrate 1 is not limited to a particular one, provided that the substrate has an electrically insulating property. For example, it is possible to employ a publicly known electrically insulating substrate.

Examples of the substrate 1 encompass an inorganic substrate made of a material such as glass or quartz, a plastic substrate made of a material such as polyethylene terephthalate or polyimide resin.

As below, Embodiment 1 will be described with reference to an example case where a glass substrate (transparent substrate) having a light-transmitting property is used as the substrate 1. However, as above described, the substrate 1 provided in the organic EL element 10 which is of the top emission type does not need to have the light-transmitting property.

Therefore, in a case where the organic EL element 10 is a top emission type organic EL element, it is possible to employ, as the substrate 1, a substrate such as (i) a semiconductor substrate such as a silicon wafer, (ii) a substrate in which a surface of a metal substrate made of aluminum (Al), iron (Fe), or the like is coated with an insulator such as a silicon oxide or an organic insulating material, or (iii) a substrate in which a surface of a metal substrate made of Al or the like is subjected to insulating treatment by a method such as anodic oxidization.

(First Electrode 2 and Second Electrode 4)

The first electrode 2 and the second electrode 4 is a pair of electrodes one of which serves as an anode and the other of which serves as a cathode.

The anode only needs to have a function as an electrode for injecting (supplying) positive holes to the organic EL layer 3. The cathode only needs to have a function as an electrode for injecting (supplying) electrons to an organic compound layer.

The anode and the cathode are not particularly limited in terms of shape, structure, size, and the like, and those properties can be appropriately selected in accordance with a use and a purpose of the organic EL element 10.

Embodiment 1 is described based on an example case where the first electrode 2 serves as an anode (see FIG. 1). Note, however, that the present invention is not limited to this and a cathode can be provided on the substrate 1. That is, in a case where one of the electrodes of the organic EL element 10 serves as an anode, the other one of the electrodes is provided as a cathode so that the electrodes function as a pair.

Electrode materials which can be used as the anode and the cathode are not limited to particular ones and, for example, publicly known electrode materials can be used.

The anode can be made of, for example, metal such as gold (Au), platinum (Pt), or nickel (Ni), a transparent electrode material such as indium tin oxide (ITO), tin oxide (SnO2), indium zinc oxide (IZO), or gallium-added zinc oxide (GZO), or the like.

Meanwhile, the cathode is preferably made of a material having a small work function for the purpose of injecting electrons to the fluorescent emission layer 34. The cathode can be made of, for example, metal such as lithium (Li), calcium (Ca), cerium (Ce), barium (Ba), or aluminum (Al), an alloy such as an Ag—Mg alloy or an Al—Li alloy containing those kinds of metal, or the like.

Note that the anode and the cathode are not particularly limited in terms of thickness, and can have a thickness determined in a manner similar to that of a conventional technique.

Light emitted from the fluorescent emission layer 34 of the organic EL layer 3 needs to be extracted from one of electrode sides, i.e., from an anode side or a cathode side. In view of this, it is preferable that one of the electrodes is made of a light-transmitting electrode material which allows light to pass through and the other one of the electrodes is made of a non-light-transmitting electrode material which does not allow light to pass through.

That is, although the first electrode 2 and the second electrode 4 can be made of various electrically conductive materials, it is preferable that, in a case where the organic EL element 10 is a top emission type organic EL element, the first electrode 2 is made of a non-light-transmitting electrode material and the second electrode 4 is made of a transparent or semitransparent light-transmitting electrode material.

Each of the first electrode 2 and the second electrode can have a single layer structure made of one (1) electrode material or can have a lamination structure made of a plurality of electrode materials.

Therefore, in a case where the organic EL element 10 is a top emission type organic EL element as above described, it is possible to employ a configuration in which, as illustrated in FIG. 1, the first electrode 2 has a lamination structure including a non-light-transmitting electrode 21 made of a non-light-transmitting electrode material and a light-transmitting electrode 22 made of a light-transmitting electrode material.

Examples of the non-light-transmitting electrode material encompass a black electrode such as tantalum (Ta) or carbon (C), a reflective metal electrode such as Al, silver (Ag), gold (Au), an Al—Li alloy, an Al-neodymium (Nd) alloy, or an Al-silicon (Si) alloy.

Examples of the light-transmitting electrode material encompass the above described transparent electrode materials and a semitransparent electrode material such as a thin film made of Ag.

(Organic EL Layer 3)

The organic EL layer 3 is a light-emitting unit which has a lamination structure including two or more layers. The organic EL layer 3 at least includes at least one layer of an exciton generating layer 33 and at least one layer of a fluorescent emission layer 34.

The organic EL element 10 in accordance with Embodiment 1 has a configuration in which a hole injection layer 31, a hole transfer layer 32, an exciton generating layer 33, a fluorescent emission layer 34, an electron transfer layer 35, and an electron injection layer 36 are provided in this order as the organic EL layer 3 between the first electrode 2 and the second electrode 4 from a first electrode 2 side (see FIG. 1).

Note that organic layers other than the exciton generating layer 33 and the fluorescent emission layer 34 are not essential layers in the organic EL layer 3, and can be appropriately provided depending on a requested characteristic of the organic EL element 10.

The above lamination order of the organic layers in the organic EL layer 3 is based on an assumption that the first electrode 2 serves as an anode and the second electrode 4 serves as a cathode. Alternatively, in a case where the first electrode 2 serves as a cathode and the second electrode 4 serves as an anode, the lamination order of the organic layers in the organic EL layer 3 is inverted. Similarly, materials respectively constituting the first electrode 2 and the second electrode 4 are also interchanged.

(Hole Injection Layer 31 and Hole Transfer Layer 32)

The hole injection layer 31 contains a positive hole injectable material and has a function to enhance efficiency of injecting positive holes into the exciton generating layer 33.

The hole transfer layer 32 contains a positive hole transferable material and has a function to enhance efficiency of transferring positive holes to the exciton generating layer 33.

Note that the hole injection layer 31 and the hole transfer layer 32 can be formed as respectively independent layers or can be integrated as a hole injection layer/hole transfer layer. It is not necessary to concurrently provide both the hole injection layer 31 and the hole transfer layer 32, and it is possible to provide only one of these, e.g., only the hole transfer layer 32. Of course, it is possible that both the hole injection layer 31 and the hole transfer layer 32 are not provided.

Materials of the hole injection layer 31, the hole transfer layer 32, and the hole injection layer/hole transfer layer, that is, the positive hole injectable material and the positive hole transferable material can be known materials.

Examples of those materials encompass chain-like or heterocyclic conjugated monomer, oligomer, polymer, or the like such as naphthalene, anthracene, azatriphenylene, fluorenone, hydrazone, stilbene, triphenylene, benzine, styryl amine, triphenylamine, porphyrin, triazole, imidazole, oxadiazole, oxazole, polyarylalkane, phenylenediamine, arylamine, and derivatives thereof, a thiophene-based compound, a polysilane-based compound, a vinylcarbazole-based compound, and an aniline-based compound.

More specifically, N,N'-di(naphthalene-1-yl)-N,N'-diphenyl-benzidine (α-NPD), 2,3,6,7,10,11-hexacyano-1,4,5,8,9,12-hexaazatriphenylene (HAT-CN), 1,3-bis(carbazole-9-yl)benzene (mCP), di-[4-(N,N-ditolyl-amino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium(III)tris[N,N'-diphenylbenzimidazole-2-ylidene-C2,C2'] (Ir(dpbic)$_3$), 4,4',4"-tris-(N-carbazolyl)-triphenylamine (TCTA), 2,2-bis(p-trimellitic oxyphenyl)propanoic acid anhydride (BTPD), bis[4-(p,p-ditolylamino)phenyl]diphenylsilane (DTASi) and the like are used.

The hole injection layer 31, the hole transfer layer 32, and the hole injection layer/hole transfer layer can be made of an intrinsic positive hole injectable material or an intrinsic positive hole transferable material which is not doped with impurity. Alternatively, the hole injection layer 31, the hole transfer layer 32, and the hole injection layer/hole transfer layer can be made of a material which is doped with impurity for the purpose of enhancing electrical conductivity and the like.

In order to achieve highly efficient light emission, it is preferable to confine excitation energy to the fluorescent emission layer 34. In view of this, as the positive hole injectable material and the positive hole transferable material, it is preferable to use a material having excitation levels, i.e., an S1 level (singlet excitation level) and a T1 level (triplet excitation level) which are higher than respective of an S1 level and a T1 level of the fluorescent emission material (fluorescent dopant material) of the fluorescent emission layer 34, and it is more preferable to use a material having excitation levels, i.e., an S1 level (singlet excitation level) and a T1 level (triplet excitation level) which are higher than respective of an S1 level and a T1 level of the material in the exciton generating layer. This is because, for example, in a case where the hole transfer layer 32 is thick and the S1 level and the T1 level of each of the hole injection layer 31 and the hole transfer layer 32 are lower than the S1 level and the T1 level of the material in the exciton generating layer 33, excitation energy may flow to the hole injection layer 31 and the hole transfer layer 32 and consequently may not be transferred to the fluorescent emission material. Therefore, it is more preferable to select, as the positive hole injectable material and the positive hole transferable material, materials which have a high excitation level and have a high mobility of positive holes. Note that, basically, the S1 level and the T1 level of the fluorescent emission material are set to be lower than respective of the S1 level and the T1 level of the material in the exciton generating layer 33.

(Electron Transfer Layer 35 and Electron Injection Layer 36)

The electron injection layer 36 contains an electron injectable material and has a function to enhance efficiency of injecting electrons into the exciton generating layer 33.

The electron transfer layer 35 contains an electron transferable material and has a function to enhance efficiency of transferring electrons to the exciton generating layer 33.

Note that the electron injection layer 36 and the electron transfer layer 35 can be formed as respectively independent layers or can be integrated as an electron injection layer/electron transfer layer. It is not necessary to concurrently provide both the electron injection layer 36 and the electron transfer layer 35, and it is possible to provide only one of these, e.g., only the electron transfer layer 35. Of course, it is possible that both the electron injection layer 36 and the electron transfer layer 35 are not provided.

Materials of the electron injection layer 36, the electron transfer layer 35, and the electron injection layer/electron transfer layer, that is, the electron injectable material and the electron transferable material can be known materials.

Examples of those materials encompass quinoline, perylene, phenanthroline, bisstyryl, pyrazine, triazole, oxazole, oxadiazole, and fluorenone, derivatives and metal complexes thereof, lithium fluoride (LiF).

More specifically, for example, 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenylbenzimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline)aluminum), LiF, and the like can be used.

The electron injection layer 36, the electron transfer layer 35, and the electron injection layer/electron transfer layer can be made of an intrinsic electron injectable material or an intrinsic electron transferable material which is not doped with impurity. Alternatively, the electron injection layer 36, the electron transfer layer 35, and the electron injection layer/electron transfer layer can be made of a material which is doped with impurity for the purpose of enhancing electrical conductivity and the like.

In order to achieve highly efficient light emission, it is preferable to confine excitation energy to the fluorescent emission layer 34. In view of this, as the electron injectable material and the electron transferable material, it is preferable to use a material having excitation levels, i.e., an S1 level (singlet excitation level) and a T1 level (triplet excitation level) which are higher than respective of an S1 level and a T1 level of the fluorescent emission material (fluorescent dopant material) of the fluorescent emission layer 34, and it is more preferable to use a material having excitation levels, i.e., an S1 level (singlet excitation level) and a T1 level (triplet excitation level) which are higher than respective of an S1 level and a T1 level of the material in the exciton generating layer. Therefore, it is more preferable to select, as the electron injectable material and the electron transferable material, materials which have a high excitation level and have a high mobility of electrons.

A thickness of each of the layers which are provided according to need is not particularly limited and can be appropriately determined in accordance with a mobility and a balance of carriers (positive holes, electrons) in each of the layers, a type of material constituting each of the layers, and the like such that excitons are generated in the exciton generating layer 33. Note that the thickness of each of those layers can be determined, for example, in a manner similar to that of a conventional technique.

(Exciton Generating Layer 33)

The exciton generating layer 33 contains at least one type of TADF material as a host material and is aimed at generating excitons.

The host material means a compound into which positive holes and electrons can be injected and has a function to cause a light emission dopant to emit light by recombining transferred positive holes and electrons in its molecules.

The TADF material is not particularly limited and can be a known material. The TADF material is a material in which an energy difference (AEST) between an S1 level and a T1 level is preferably less than 0.1 eV, that is, AEST<0.1 eV holds true, and more preferably AEST<0.05 eV holds true.

Examples of the TADF material encompass 10-phenyl-10H,10'H-spiro[acridine-9,9'-anthracene]-10'-one (ACRSA), 3-(9,9-dimethylacridine-10(9H)-yl)-9H-xanthene-9-one (ACRXTN), 1,2,3,5-tetrakis(carbazole-9-yl)-4,6-dicyanobenzene (4CzIPN), 2-phenoxazine-4,6-diphenyl-1,3,5-triazine (PXZ-TRX), 2,4,6-tri(4-(10H-phenoxazine-10H-yl)phenyl)-1,3,5-triazine (tri-PXZ-TRZ).

In a case where, for example, TTPA is used as the light emission dopant, it is preferable to use ACRXTN, ACRSA, or the like among those TADF materials from the viewpoint of a combination with the light emission dopant.

The S1 level of the TADF material in the exciton generating layer 33 is preferably equal to or higher than the S1 level (i.e., energy level) of the fluorescent emission material (fluorescent dopant material) in the fluorescent emission layer 34. This allows Forster type energy transfer (resonance energy transfer, Forster transition) from the exciton generating layer 33 to the fluorescent emission layer 34. Moreover, it is possible to prevent energy transfer from the fluorescent emission layer 34 to the exciton generating layer 33. This makes it possible to improve light emission efficiency of the fluorescent emission layer 34.

A HOMO level of the TADF material in the exciton generating layer 33 is preferably higher than a HOMO level of the fluorescent emission material in the fluorescent emission layer 34, and a LUMO level of the TADF material in the exciton generating layer 33 is preferably lower than a LUMO level of the fluorescent emission material in the fluorescent emission layer 34. This causes positive holes and electrons to readily enter the exciton generating layer 33 rather than the fluorescent emission layer 34. This makes it possible to heighten exciton generation probability in the exciton generating layer 33, and it is therefore possible to improve efficiency of generating singlet excitons. As a result, it is possible to improve light emission efficiency of the fluorescent emission layer 34.

Note that the HOMO level can be obtained by measuring threshold energy of photoelectrons discharged by irradiation with an ultraviolet ray with use of a device such as an atmospheric photoelectron spectral device "AC-3" manufactured by Riken Keiki Co., Ltd. Meanwhile, the LUMO level can be obtained by calculation using the HOMO level measured by the above method and a band gap obtained based on energy at an absorption edge of an absorption spectrum caused by irradiation with an ultraviolet ray with use of a device such as an ultraviolet and visible spectrophotometer "UV-2450" manufactured by Shimadzu Corporation.

In comparison between HOMO levels and comparison between LUMO levels, an energy difference is important rather than values themselves, and the HOMO level and the LUMO level can be obtained by ordinary methods. In view of this, it is preferable to compare HOMO levels (or LUMO levels) which have been measured with the same method (here, details of the measuring method are not described).

The exciton generating layer 33 can be made of two or more materials which are appropriately mixed. This makes it possible, for example, to change carrier mobility of the exciton generating layer 33. For example, by adjusting the carrier mobility by mixing TADF materials which are different in carrier mobility, it is possible to heighten exciton generation probability in the exciton generating layer 33. As a result, it is possible to improve efficiency of generating singlet excitons, and this makes it possible to improve light emission efficiency of the fluorescent emission layer 34.

The exciton generating layer 33 is ideally made of at least one type of TADF material and does preferably not contain a non-TADF material, in particular, a light emission dopant. In a case where the exciton generating layer 33 contains a non-TADF material, the non-TADF material may generate excitons. In a case where the exciton generating layer 33 is made of only a TADF material, the exciton generating layer 33 can generate singlet excitons at a ratio of 100% without deteriorating light emission efficiency.

However, even in a case where the exciton generating layer 33 contains a non-TADF material, it is possible to improve light emission efficiency by separately providing the exciton generating layer 33 and the fluorescent emission layer 34, as compared with a conventional case where a TADF material and a non-TADF material are uniformly mixed in a luminescent layer.

As such, the exciton generating layer 33 does preferably not substantially contain a non-TADF material, in particular, a fluorescent dopant material (fluorescent emission material), and is more preferably made of only a TADF material without non-TADF material. However, the absence of non-TADF material is not essential.

In a case where the exciton generating layer 33 contains a non-TADF material (i.e., a compound different from a TADF material), it is preferable that an S1 level and a T1 level of each of all non-TADF materials contained in the exciton generating layer 33 are higher than respective S1 level and T1 level of each of all TADF materials in the exciton generating layer 33 and higher than respective S1 level and T1 level of each of all fluorescent dopant materials in the fluorescent emission layer 34. From this, in a case where the non-TADF material is contained in the exciton generating layer 33, it is possible to prevent energy from transferring to the non-TADF material.

Note that, in a case where the exciton generating layer 33 contains the non-TADF material, a total ratio of TADF materials in the exciton generating layer 33 is preferably 50 w % or higher, more preferably 90 w % or higher. The total ratio of TADF materials in the exciton generating layer 33 is most preferably 100 w %.

In Embodiment 1, the thickness of the exciton generating layer 33 is preferably 10 nm or less from the viewpoint of efficiency of utilization of excitons generated in the exciton generating layer 33.

The Forster transition from an S1 level of the TADF material to an S1 level of the fluorescent emission material occurs even in a case where the TADF material and the fluorescent emission material do not directly make contact with each other, provided that the TADF material and the fluorescent emission material are located so that the TADF material is away, by a given distance or less, from the fluorescent emission material. In a case where a distance from a molecule of the TADF material to a molecule of the fluorescent emission material is 10 nm or less, the Forster transition surely occurs and energy transfer efficiency is not impaired.

In Embodiment 1, d=d1 holds true, where d is a distance from a molecule of a TADF material in the exciton generating layer 33 which material is farthest from a fluorescent emission material (i.e., a molecule of a TADF material located in a surface of the exciton generating layer 33 which surface is opposite to the fluorescent emission layer 34) to a molecule of a fluorescent emission material of the fluorescent emission layer 34 which material is nearest to a TADF material (i.e., a molecule of a fluorescent emission material located in a surface of the fluorescent emission layer 34 which surface is on the exciton generating layer 33 side), and d1 is a thickness of the exciton generating layer 33.

In this case, by setting the thickness d1 to 10 nm or less, it is possible to set the distance d to 10 nm or less. That is, in Embodiment 1, in a case where the thickness d1 is set to 10 nm or less, a shortest distance from an arbitrary location of the exciton generating layer 33 to the fluorescent emission layer 34 surely becomes 10 nm or less. With the arrangement, the Forster transition occurs even in the molecule of the TADF material located in the surface of the exciton generating layer 33 which surface is opposite to the fluorescent emission layer 34. Therefore, in this case, it is possible to cause the Forster transition in molecules of all TADF materials in the exciton generating layer 33.

(Fluorescent Emission Layer 34)

The fluorescent emission layer 34 contains at least one type of fluorescent emission material (fluorescent dopant material, fluorescent emission material) and substantially emits light. In other words, the fluorescent emission layer 34 is provided mainly for the purpose of light emission.

The fluorescent dopant material is a compound which has a function to emit light by receiving recombination energy of positive holes and electrons and in which light emission is observed.

A known material which emits fluorescence can be used as the fluorescent dopant material, and a material such as a low-molecular fluorescent pigment, a metal complex, or the like which is high in light emission efficiency is suitably used.

Examples of the fluorescent dopant material encompass 9,10-bis[N,N-di-(p-tolyl)-amino]anthracene (TTPA), 1,2,3,5-tetrakis(carbazole-9-yl)-4,6-dicyanobenzene (4CzIPN), 2,5,8,11-tetra-tert-butylperylene (TBPe), 2,8-ditert-butyl-5,11-bis(4-tert-butylphenyl)-6,12-diphenyltetracene (TBRb), tetraphenyldibenzoperiflanthene (DBP), 5,6-bis[4-(10-phenyl-9-anthryl)phenyl]-2,2'-bipyridine (PAP2BPy), 5,6-bis[4'-(10-phenyl-9-anthryl)biphenyl-4-yl]-2,2'-bipyridine (PAPP2BPy), N,N'-bis[4-(9-phenyl-9H-fluorene-9-yl)phenyl]-N,N'-diphenyl-pyrene-1,6-diamine (1,6FLPAPrn), N,N'-bis[4-(9H-carbazole-9-yl)phenyl]-N,N'-diphenylstilbene-4,4'-diamine (YGA2S), 4-(9H-carbazole-9-yl)-4'-(10-phenyl-9-anthryl)triphenylamine (YGAPA), 4-(9H-carbazole-9-yl)-4'-(9,10-diphenyl-2-anthryl)triphenylamine (2YGAPPA), N,9-diphenyl-N-[4-(10-phenyl-9-anthryl)phenyl]-9H-carbazole-3-amine (PCAPA), perylene, 2,5,8,11-tetra-tert-butylperylene (TBP), 4-(10-phenyl-9-anthryl)-4'-(9-phenyl-9H-carbazole-3-yl)triphenylamine (PCBAPA), N,N''-(2-tert-butylanthracene-9,10-diyldi-4,1-phenylene)bis[N,N',N'-triphenyl-1,4-phenylenediamine] (DPABPA), N,9-diphenyl-N-[4-(9,10-diphenyl-2-anthryl)phenyl]-9H-carbazole-3-amine (2PCAPPA), N-[4-(9,10-diphenyl-2-anthryl)phenyl]-N,N',N'-triphenyl-1,4-phenylenediamine (2DPAPPA), N,N,N',N',N'',N''',N'''-octaphenyldibenzo[g,p]chrysene-2,7,10,15-tetraamine (DBC1), coumarin 30, N-(9,10-diphenyl-2-anthryl)-N,9-diphenyl-9H-carbazole-3-amine (2PCAPA), N-[9,10-bis(1,1'-biphenyl-2-yl)-2-anthryl]-N,9-diphenyl-9H-carbazole-3-amine (2PCABPhA), N-(9,10-diphenyl-2-anthryl)-N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)-N-[4-(9H-carbazole-9-yl)phenyl]-N-phenylanthracene-2-amine (2YGABPhA), N,N,9-triphenylanthracene-9-amine (DPhAPhA) coumarin 545T, N,N'-diphenylquinacridone (DPQd), rubrene, 5,12-bis(1,1'-biphenyl-4-yl)-6,11-diphenyltetracene (BPT), 2-(2-{2-[4-(dimethylamino)phenyl]ethenyl}-6-methyl-4H-pyran-4-ylidene)propanedinitrile (DCM1), 2-{2-methyl-6-[2-(2,3,6,7-tetrahydro-1H,5H-benzo[ij]quinolizine-9-yflethenyl]-4H-pyran-4-ylidene}propanedinitrile (DCM2), N,N,N',N'-tetrakis(4-methylphenyl)tetracene-5,11-diamine (p-mPhTD), 7,14-diphenyl-N,N,N',N'-tetrakis(4-methylphenyflacenaphtho[1,2-a]fluoranthene-3,10-diamine (p-mPhAFD), 2-{2-isopropyl-6-[2-(1,1,7,7-tetramethyl-2,3,6,7-tetrahydro-1H,5H-benzo[ij]quinolizine-9-yl)ethenyl]-4H-pyran-4-ylidene}propanedinitrile (DCJTI), 2-{2-tert-butyl-6-[2-(1,1,7,7-tetramethyl-2,3,6,7-tetrahydro-1H,5H-benzo[ij]quinolizine-9-yl)ethenyl]-4H-pyran-4-ylidene}propanedinitrile (DCJTB), 2-(2,6-bis{2-[4-(dimethylamino)phenyl]ethenyl}-4H-pyran-4-ylidene)propanedinitrile (BisDCM), 2-{2,6-bis[2-(8-methoxy-1,1,7,7-tetramethyl-2,3,6,7-tetrahydro-1H,5H-benzo[ij]quinolizine-9-yl) ethenyl]-4H-pyran-4-ylidene} propanedinitrile (BisDCJTM), and the like.

The fluorescent emission layer 34 can be made of two or more mixed materials. For example, in a case where an electron transferable material is mixed with a fluorescent emission material, it is possible to enhance electron transferability from the fluorescent emission layer 34 to the exciton generating layer 33, and it is therefore possible to improve efficiency of generating excitons.

More specifically, in a case where the fluorescent emission layer 34 contains, for example, mCP which is an electron transferable material as a host material, carriers are more likely to gather in the exciton generating layer 33. As such, in a case where the fluorescent emission layer 34 contains an electron transferable host material, excitons are more likely to be generated in the exciton generating layer 33. Note that mCP is merely an example, and a host material used in the fluorescent emission layer 34 is not limited to this.

In a case where the fluorescent emission layer 34 thus contains a material different from the fluorescent emission material (fluorescent dopant material), it is preferable that an S1 level and a T1 level of each of all materials different from the fluorescent emission material in the fluorescent emission layer 34 are higher than respective S1 level and T1 level of the fluorescent emission material contained in the fluorescent emission layer 34, and higher than respective S1 level and T1 level of the TADF material in the exciton generating layer 33. With this feature, in a case where the fluorescent emission layer 34 contains a material different from the fluorescent emission material, it is possible to prevent energy from being transferred to the material.

Note that, in a case where the fluorescent emission layer 34 contains a material different from the fluorescent emission material, a ratio of the fluorescent emission material in the fluorescent emission layer 34 is not particularly limited and can be arbitrarily determined in accordance with a layer thickness of the fluorescent emission layer 34, types of host material and fluorescent emission material, and the like. In a case where a concentration of the fluorescent emission material is excessively low, light emission efficiency is deteriorated and, in a case where the concentration of the fluorescent emission material is excessively high, light emission efficiency is lowered due to concentration quenching. In view of this, the ratio of the fluorescent emission material preferably falls within a range between 1 wt % and 30 wt %, more preferably falls within a range between 3 wt % and 20 wt %.

A ratio of the fluorescent emission material in the fluorescent emission layer 34 relative to the TADF material in the exciton generating layer 33 is also not particularly limited and can be arbitrarily determined in accordance with types of TADF material and fluorescent emission material and the like.

The fluorescent emission layer 34 can contain, for example, a TADF material as a fluorescent emission material. For example, 4CzIPN is a thermally activated delayed fluorescent substance which emits green light.

Note that, even under a driving condition in which excitons are generated outside of the exciton generating layer 33, in a case where the fluorescent emission material itself is a TADF material or contains a TADF material as above described, the TADF material is directly excited and emits light in the fluorescent emission layer 34, and consequently light emission efficiency is improved by a component which is thus directly excited.

Note that a location at which excitons are generated (in other words, whether or not excitons are generated) depends on a carrier balance and a layer structure. From this, even in a case where a TADF material is used as a fluorescent dopant material (TADF dopant material) as above described, it is possible to cause the TADF dopant material to refrain from generating excitons by, for example, adjusting a carrier mobility, provided that the exciton generating layer 33 and the fluorescent emission layer 34 are separated (i.e., independently provided) as in Embodiment 1.

Note, however, that Embodiment 1 does not exclude a case where the fluorescent emission layer 34 contains a TADF host material. The fluorescent emission layer 34 preferably does not substantially contain a TADF host material. However, according to Embodiment 1, the exciton generating layer 33 is provided separately from the fluorescent emission layer 34 which contributes to light emission, and this makes it possible to improve light emission efficiency as compared with a conventional technique. Therefore, the fluorescent emission layer 34 can contain a TADF host material or a TADF dopant material.

A thickness of the fluorescent emission layer 34 can be determined as appropriate in accordance with a carrier mobility of the exciton generating layer 33, a balance between carrier mobilities of materials around the fluorescent emission layer 34, types of material constituting the fluorescent emission layer 34, and the like. Moreover, the fluorescent emission layer 34 does not necessarily need to emit light from an entire region in a thickness direction. Therefore, the thickness of the fluorescent emission layer 34 is not particularly limited and can be arbitrarily set to be an intended thickness.

<Process for Producing Organic EL Element 10>

Here, a process for producing the organic EL element 10 will be briefly described. Note that, in general, an organic EL element includes a transistor as a switching element. However, in Embodiment 1, a process for producing the transistor will not be described.

The following description will discuss processes for forming a first electrode 2, an organic EL layer 3, and a second electrode 4 on a substrate 1 on which a plurality of transistors have been provided in an island manner.

First, a pattern of the first electrode 2 is formed on each of the plurality of transistors on the substrate 1 (first electrode forming step). Note that, in Embodiment 1, the pattern of the first electrode 2 is formed by laminating a non-light-transmitting electrode 21 and a light-transmitting electrode 22 in this order.

Next, on the pattern of the first electrode 2, organic layers constituting the organic EL layer 3 are formed (organic layer forming step). Note that, in order to secure an electrically insulating property around the first electrode 2, it is possible to provide an electrically insulating organic film (not illustrated) around the first electrode 2. The electrically insulating organic film can be made of, for example, a polyimide-based resin material or the like. Note, however, that the electrically insulating organic film is not particularly limited to this and can be made of, for example, a publicly known organic insulating material.

Methods for forming the layers constituting the organic EL layer 3 are not particularly limited, and known methods can be employed which encompass dry film forming methods such as a vacuum vapor deposition method, a sputtering method, a plasma method, and an ion plating method; and wet film forming methods such as a spin coating method, a dipping method, a flow coating method, and an inkjet method; and the like.

In this case, in Embodiment 1, the fluorescent emission layer 34 is provided separately from the exciton generating layer 33 as above described. In Embodiment 1, the organic EL layer 3 includes the hole injection layer 31, the hole transfer layer 32, the exciton generating layer 33, the fluorescent emission layer 34, the electron transfer layer 35, and the electron injection layer 36 which are stacked in this order.

Note that, in a case where each of the layers constituting the organic EL layer 3 contains two or more materials, the materials can be subjected to, for example, codeposition. For example, in a case where the fluorescent emission layer 34 contains a host material as above described, the host material and a fluorescent emission material are subjected to codeposition. In this case, the host material is doped with the fluorescent emission material.

Lastly, the second electrode 4 is formed on the organic EL layer 3 (second electrode forming step), and thus the organic EL element 10 is produced.

<Effect>

The following description will discuss an effect of Embodiment 1 with reference to (a) through (c) of FIG. 2.

In general, a luminescent layer is constituted by a two-component system including (i) a host material contributing to transfer of positive holes and electrons and (ii) a light emission dopant (guest) material contributing to light emission. The light emission dopant material is uniformly dispersed in the host material which is a main component.

In Patent Literatures 1 and 2, a TADF material and a fluorescent emission material which is a fluorescent dopant material (light emission dopant material) that substantially emits light exist together in the same layer.

In a case where the TADF material is used as a host material, singlet excitons can be generated at a ratio of 100%, provided that excitons are generated in the host material. However, in general, the dopant material is lower in S1 level than the TADF material which is the host material. Therefore, the excitons themselves are more likely to be generated in the dopant material, and triplet excitons which do not emit light are generated.

On the other hand, in a case where the TADF material is used as the fluorescent dopant material, excitons are not necessarily generated only in the fluorescent dopant material because a concentration ratio of the fluorescent dopant material is lower than that of the host material, and therefore light emission efficiency is lowered. Moreover, in a case where the concentration ratio of the fluorescent dopant material is increased, concentration quenching occurs and accordingly light emission efficiency is lowered.

Such a problem inevitably occurs in a case where the TADF material and the non-TADF material are mixed by codeposition or the like.

However, according to studies by the inventors of the present invention, Forster transition from an S1 level of the TADF material to an S1 level of the fluorescent emission material actually occurs even in a case where the TADF material which is the host material contributing to transfer of positive holes and electrons does not directly contact with the fluorescent dopant material contributing to light emission, provided that the TADF material and the fluorescent dopant material are located within a certain distance (preferably 10 nm or less) as early described, and efficiency is not impaired.

In view of this, in Embodiment 1, the exciton generating layer 33 is provided separately from the fluorescent emission layer 34 which contributes to light emission so as to separate functions of a conventional luminescent layer, i.e., functions to emit light and generate excitons. As such, the layer which substantially emits light is separated from the layer which substantially generates excitons.

Each of (a) through (c) of FIG. 2 is an explanatory view schematically illustrating Forster transition between the exciton generating layer 33 and the fluorescent emission layer 34 in the organic EL element 10 in accordance with Embodiment 1.

As illustrated in (a) of FIG. 2, in a case where the exciton generating layer 33 and the fluorescent emission layer 34 are separately provided and the exciton generating layer 33 is at a location for recombining carriers, excitons are not directly generated in the fluorescent emission layer 34 but excitons are generated in the exciton generating layer 33.

Even in a case where the TADF material does not directly contact with the fluorescent dopant material which contributes to light emission, Forster transition occurs from a molecule 33a of the TADF host material in an excitation state in the exciton generating layer 33 to a molecule 34a of the fluorescent dopant material in the fluorescent emission layer 34, provided that the TADF material and the fluorescent dopant material are located within a certain distance (preferably 10 nm or less) (see (a) of FIG. 2).

Note that an optional layer can be provided between the first electrode 2 and the exciton generating layer 33 and/or between the second electrode 4 and the fluorescent emission layer 34. Moreover, another layer can be provided between the exciton generating layer 33 and the fluorescent emission layer 34, depending on a thickness or an arrangement of the exciton generating layer 33. The exciton generating layer 33 does not necessarily need to contact with the fluorescent emission layer 34 (i.e., these layers do not necessarily need to be consecutively laminated).

In Embodiment 1, as illustrated in (b) and (c) of FIG. 2, Forster transition occurs from the singlet excitation state S1 of the TADF material in the exciton generating layer 33 to the singlet excitation state S1 of the fluorescent dopant material in the fluorescent emission layer 34. Moreover, Forster transition occurs from the triplet excitation state T1 of the TADF material in the exciton generating layer 33 to the singlet excitation state S1 of the fluorescent dopant material in the fluorescent emission layer 34 via inverse intersystem crossing to the singlet excitation state S1 of the TADF material in the exciton generating layer 33.

In Embodiment 1, the TADF host material and the fluorescent dopant material exist in different layers, that is, the TADF host material and the fluorescent dopant material are not mixed in the same layer.

More specifically, in Embodiment 1, the TADF material (thermally activated delayed fluorescent substance, TADF host material) and the fluorescent emission material (fluorescent emission body, fluorescent dopant material) are provided in different layers, and the exciton generating layer 33 is at a location for recombining carriers. Therefore, excitons are not directly generated in the fluorescent emission layer 34 but excitons are generated in the exciton generating layer 33.

As such, in Embodiment 1, singlet excitons can be generated in the fluorescent emission layer 34 at a ratio of substantially 100% as illustrated in (c) of FIG. 2, and light emission occurs from the singlet excitation state S1 of the fluorescent dopant material in the fluorescent emission layer 34 without impairing light emission efficiency. Therefore, according to Embodiment 1, it is possible to provide the organic EL element 10 which can improve light emission efficiency as compared with a conventional technique.

Next, Embodiment 1 will be further described in detail with reference to Example. In Example below, some constituent elements have specific dimensions and are made of specific materials. Note, however, that Embodiment 1 is not limited only to the specific dimensions and materials. That is, Embodiment 1 is not limited only to the following Example.

Example 1

In this Example, as illustrated in FIG. 1, a non-light-transmitting electrode 21, a light-transmitting electrode 22, a hole injection layer 31, a hole transfer layer 32, an exciton generating layer 33, a fluorescent emission layer 34, an electron transfer layer 35, an electron injection layer 36, and a second electrode 4 are stacked on a substrate 1 in this order.

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm) Hole transfer layer 32: α-NPD (20 nm) Exciton generating layer 33: ACRXTN (5 nm) Fluorescent emission layer 34: TTPA (5 nm) Electron transfer layer 35: Bphen (20 nm)

Electron injection layer 36: LiF (1 nm)

Second electrode 4 (cathode): Ag—Mg alloy (Ag/Mg mixture ratio=0.9/0.1) (20 nm)

As such, with the combination of the hole transfer layer 32 which is the α-NPD layer having a thickness of 20 nm and the electron transfer layer 35 which is a Bphen layer having a thickness of 20 nm, electron transferability is higher than positive hole transferability. With the arrangement, electrons and positive holes are more likely to recombine on an anode side in the organic EL layer 3, rather than on a cathode side.

From this, in such a case, excitons can be efficiently generated in the exciton generating layer 33 by providing the exciton generating layer 33 so as to be closer to the anode side than the fluorescent emission layer 34 is, as illustrated in FIG. 1. In view of this, in Example 1, the exciton generating layer 33 and the fluorescent emission layer 34 are provided such that the exciton generating layer 33 is located on a hole transfer layer 32 side and the fluorescent emission layer 34 is located on an electron transfer layer 35 side as illustrated in FIG. 1.

An S1 level of ACRXTN is 2.53 eV, and a T1 level of ACRXTN is 2.47 eV. Meanwhile, an S1 level of TTPA is 2.34 eV, and a T1 level of TTPA is lower than 2.34 eV. Therefore, ACRXTN and TTPA have the following relations: S1 level of ACRXTN>S1 level of TTPA; and T1 level of ACRXTN>T1 level of TTPA.

Moreover, ACRXTN and TTPA have the following relations: HOMO level of ACRXTN>HOMO level of TTPA; and LUMO level of ACRXTN<LUMO level of TTPA.

Moreover, in Example 1, a thickness d1 (d1=d) of the exciton generating layer 33 and a thickness of the fluorescent emission layer 34 are thin, i.e., 5 nm, and therefore interlayer energy transfer easily occurs.

Therefore, in Example 1, Forster transition occurs from the TADF host material to the fluorescent dopant material, and singlet excitons generated in the TADF host material at a ratio of 100% are all transferred to the fluorescent dopant material. From this, according to Example 1, it is possible to provide the organic EL element which can improve light emission efficiency as compared with a conventional technique.

Note that, in Example 1, if an electron transferable host material (e.g., mCBP) is mixed in the fluorescent emission layer 34, carriers are further more likely to gather in the exciton generating layer 33. In such a case, excitons are more easily generated in the exciton generating layer 33.

An S1 level of mCBP is 3.37 eV, and a T1 level of mCBP is 2.90 eV. As such, the S1 level and the T1 level of mCBP are higher than the respective S1 level and T1 level of ACRXTN and higher than the respective S1 level and T1 level of TTPA. Therefore, even in a case where the fluorescent emission layer 34 contains mCBP, energy is not transferred to mCBP.

Embodiment 2

The following description will discuss another embodiment of the present invention with reference to FIG. 3.

In Embodiment 2, a difference from Embodiment 1 will be described. The same reference numerals are given to constituent elements which have functions identical with those described in Embodiment 1, and such constituent elements will not be repeatedly described. Note that it is of course possible to alter Embodiment 2 in a manner similar to that in Embodiment 1.

<Schematic Configuration of Organic EL Element 10>

FIG. 3 is a cross-sectional view illustrating a schematic configuration of an organic EL element 10 in accordance with Embodiment 2.

Note that, in Embodiment 2 also, an example case is illustrated in which a first electrode 2 serves as an anode, and a second electrode 4 serves as a cathode.

In the organic EL element 10 in accordance with Embodiment 2 also, the first electrode 2, an organic EL layer 3, and the second electrode 4 are stacked in this order on a substrate 1 which serves as a base (see FIG. 3).

The organic EL element 10 in accordance with Embodiment 2 is a bottom emission type organic EL element in which light emitted from a fluorescent emission layer 34 in the organic EL layer 3 is extracted on a substrate 1 side.

In a case where the organic EL element 10 is the bottom emission type, the substrate 1 is constituted by an electrically insulating substrate having a light-transmitting property (such as a glass substrate, plastic substrate), which substrate is called transparent substrate or light-transmitting substrate.

Moreover, in a case where the organic EL element 10 is a bottom emission type, it is preferable that the first electrode 2 is made of a light-transmitting or semi-light-transmitting electrode material such as a transparent electrode, and the second electrode 4 is made of a non-light-transmitting electrode material such as a reflective metal electrode.

The electrically insulating substrate having a light-transmitting property, the light-transmitting or semi-light-transmitting electrode material, and the non-light-transmitting electrode material can be, for example, the materials exemplified in Embodiment 1.

The organic EL element 10 in accordance with Embodiment 2 is basically identical with the organic EL element 10 in accordance with Embodiment 1, except that the organic EL element 10 in accordance with Embodiment 2 is the bottom emission type organic EL element, the first electrode 2 is made of the light-transmitting or semi-light-transmitting electrode material, and the second electrode 4 is made of the non-light-transmitting electrode material.

The following description will specifically discuss a configuration of the organic EL element 10 in accordance with Embodiment 2 with reference to Example. In Example described below also, some constituent elements have specific dimensions and are made of specific materials. Note, however, that Embodiment 2 is also not limited only to the following Example.

Example 2

In Example 2, as illustrated in FIG. 3, a light-transmitting electrode 22, a hole injection layer 31, a hole transfer layer 32, an exciton generating layer 33, a fluorescent emission layer 34, an electron transfer layer 35, an electron injection layer 36, and the second electrode 4 are stacked in this order on the substrate 1.

The substrate 1 is a glass substrate. The followings are materials and thicknesses of the layers stacked on the substrate 1.

Light-transmitting electrode 22 (first electrode 2, anode): ITO, 100 nm
    Hole injection layer 31: HAT-CN (10 nm)
    Hole transfer layer 32: α-NPD (20 nm)
    Exciton generating layer 33: ACRXTN (5 nm)
    Fluorescent emission layer 34: TTPA (5 nm)
    Electron transfer layer 35: Bphen (20 nm)
    Electron injection layer 36: LiF (1 nm)
Second electrode 4 (cathode, non-light-transmitting electrode, reflective electrode): Al (100 nm)

An organic EL element 10 in accordance with Example 2 is basically identical with the organic EL element 10 in accordance with Example 1, except that the materials and the thicknesses of the first electrode 2 and the second electrode 4 in Example 2 are different from those in Example 1.

Therefore, Example 2 can bring about an effect similar to that of Example 1, except the followings: that is, in Example 1, light emitted from the fluorescent emission layer 34 is extracted on the second electrode 4 side directly or after being reflected by the non-light-transmitting electrode 21 made of a reflective electrode whereas, in Example 2, light emitted from the fluorescent emission layer 34 is extracted on the second electrode 4 side directly or after being reflected by the second electrode 4 made of a reflective electrode.

<Effect>

As above described, according to Embodiment 2, it is possible to provide the bottom emission type organic EL element 10 which brings about an effect similar to that of Embodiment 1.

Embodiment 3

The following description will discuss still another embodiment of the present invention with reference to FIG. 4.

In Embodiment 3 also, a difference from Embodiment 1 will be described. The same reference numerals are given to constituent elements which have functions identical with those described in Embodiment 1, and such constituent elements will not be repeatedly described. Note, however, that, Embodiment 3 can be of course altered in a manner similar to those of Embodiments 1 and 2. For example, although a top emission type organic EL element is employed as an example in Embodiment 3 and a difference from Embodiment 1 will be described, it is of course possible to employ a bottom emission type in Embodiment 3, as with Embodiment 2.

<Schematic Configuration of Organic EL Element 10>

FIG. 4 is a cross-sectional view illustrating a schematic configuration of an organic EL element 10 in accordance with Embodiment 3.

Note that, in Embodiment 3 also, an example case is illustrated in which a first electrode 2 serves as an anode, and a second electrode 4 serves as a cathode.

The organic EL element 10 in accordance with Embodiment 3 is basically identical with the organic EL element 10 in accordance with Embodiment 1, except that positive hole transferability is higher than electron transferability and the exciton generating layer 33 is provided so as to be closer to a cathode side (i.e., on a second electrode 4 side) than the fluorescent emission layer 34 is.

<Effect>

In a case where positive hole transferability is higher than electron transferability, recombination of carriers is more likely to occur on the cathode side, rather than the anode side.

Therefore, in a case where positive hole transferability is higher than electron transferability, excitons can be more efficiently generated by providing the exciton generating layer 33 so as to be closer to the cathode side than the fluorescent emission layer 34 is.

The following description will specifically discuss a configuration of the organic EL element 10 in accordance with Embodiment 3 with reference to Examples. In Examples described below also, some constituent elements have specific dimensions and are made of specific materials. Note, however, that Embodiment 3 is also not limited only to the following Examples.

Example 3

In Example 3, as illustrated in FIG. 4, a non-light-transmitting electrode 21, a light-transmitting electrode 22, a hole injection layer 31, a hole transfer layer 32, a fluorescent emission layer 34, an exciton generating layer 33, an electron transfer layer 35, an electron injection layer 36, and a second electrode 4 are stacked in this order on a substrate 1.

The substrate 1 is a glass substrate. The followings are materials and thicknesses of the layers stacked on the substrate 1.

Non-light-transmitting electrode 21 (first electrode 2, anode, reflective electrode): Ag, 100 nm
Light-transmitting electrode 22 (first electrode 2, anode): ITO, 30 nm
    Hole injection layer 31: HAT-CN (10 nm)
    Hole transfer layer 32: α-NPD (10 nm)
    Fluorescent emission layer 34: TTPA (5 nm)
    Exciton generating layer 33: ACRXTN (5 nm)
    Electron transfer layer 35: Bphen (40 nm)
    Electron injection layer 36: LiF (1 nm)
Second electrode 4 (cathode): Ag—Mg alloy (Ag/Mg mixture ratio=0.9/0.1) (20 nm)

An organic EL element 10 in accordance with Example 3 is basically identical with the organic EL element 10 in accordance with Example 1, except that a thickness of an α-NPD layer which is the hole transfer layer 32 is 10 nm, a thickness of a Bphen layer which is the electron transfer layer 35 is 40 nm, the exciton generating layer 33 is provided on an electron transfer layer 35 side, and the fluorescent emission layer 34 is provided on a hole transfer layer 32 side.

In a case where the α-NPD layer is used as the hole transfer layer 32 and the Bphen layer is used as the electron transfer layer 35 as in Example 3, electron transferability is higher than positive hole transferability, provided that the thicknesses of both the layers are 20 nm as in Example 1.

However, in Example 3, a thickness of the electron transfer layer 35 is thick, i.e., 40 nm, and therefore electron transferability is low. Further, a thickness of the hole transfer layer 32 is thin, i.e., 10 nm, and therefore positive hole transferability is high. From this, recombination of carriers is more likely to occur on the second electrode 4 (i.e., cathode) side, in other words, on an electron transfer layer 35 side rather than on a hole transfer layer 32 side. Therefore, excitons can be efficiently generated by providing the exciton generating layer 33 so as to be closer to the electron transfer layer 35 than the fluorescent emission layer 34 is.

As such, carrier mobilities and a balance between carrier mobilities of the respective layers vary depending on, for example, materials, thicknesses, and the like of layers constituting the organic EL layer 3. Moreover, as early described, the hole transfer layer 32 and the electron transfer layer 35 are not essential layers. Therefore, carrier mobilities and a balance between carrier mobilities of respective layers of course vary in accordance with a lamination structure of the organic EL layer 3.

Therefore, by providing the exciton generating layer 33 at a location at which recombination of carriers occurs in accordance with carrier mobilities of the respective layers constituting the organic EL layer 3, a balance of the carrier mobilities of the respective layers, and the like, it is possible to more efficiently generate excitons and to further improve light emission efficiency.

In Example 3 also, ACRXTN and TTPA have the following relations: HOMO level of ACRXTN>HOMO level of TTPA; and LUMO level of ACRXTN<LUMO level of TTPA.

Therefore, even in a case where the lamination order of the fluorescent emission layer 34 and the exciton generating layer 33 is switched as above described, positive holes and electrons are more likely to enter the exciton generating layer 33, rather than the fluorescent emission layer 34. From this, exciton generation probability in the exciton generating layer 33 can be heightened, and it is therefore possible to improve efficiency of generating excitons and to improve light emission efficiency of the fluorescent emission layer 34.

Example 4

In Embodiment 3 also, at least one of the exciton generating layer 33 and the fluorescent emission layer 34 can contain two or more materials.

An organic EL element 10 in accordance with Example 4 is basically identical with the organic EL element 10 in accordance with Example 3, except that mCP which is a positive hole transferable material is mixed in the fluorescent emission layer 34 as a host material.

That is, in Example 4 also, a non-light-transmitting electrode 21, a light-transmitting electrode 22, a hole injection layer 31, a hole transfer layer 32, a fluorescent emission layer 34, an exciton generating layer 33, an electron transfer layer 35, an electron injection layer 36, and a second electrode 4 are stacked in this order on a substrate 1, as with Example 3 (see FIG. 4).

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (10 nm)

Fluorescent emission layer 34: mCP/TTPA (mCP/TTPA mixture ratio=0.9/0.1) (5 nm)

Exciton generating layer 33: ACRXTN (5 nm)

Electron transfer layer 35: Bphen (40 nm)

Electron injection layer 36: LiF (1 nm)

Second electrode 4 (cathode): Ag—Mg alloy (Ag/Mg mixture ratio=0.9/0.1) (20 nm)

In Example 4, by thus mixing the positive hole transferable host material in the fluorescent emission layer 34, positive hole transferability to the exciton generating layer 33 is heightened, and carriers are more likely to gather in the exciton generating layer 33. Therefore, according to Example 4, it is possible to further improve efficiency of generating excitons.

Moreover, as early described, an S1 level of ACRXTN is 2.53 eV, and a T1 level of ACRXTN is 2.47 eV. Meanwhile, an S1 level of TTPA is 2.34 eV, and a T1 level of TTPA is lower than 2.34 eV. Therefore, ACRXTN and TTPA have the following relations: S1 level of ACRXTN>S1 level of TTPA; and T1 level of ACRXTN>T1 level of TTPA.

From this, Forster transition is more likely to occur from the exciton generating layer 33 to the fluorescent emission layer 34.

Moreover, an S1 level of mCP is 3.40 eV, and a T1 level of mCP is 2.90 eV. As such, the S1 level and the T1 level of mCP are higher than respective S1 level and T1 level of ACRXTN and higher than respective S1 level and T1 level of TTPA. Therefore, even in a case where the fluorescent emission layer 34 contains mCP, energy is not transferred to mCP.

From this, according to Example 4, it is possible to further improve efficiency of generating excitons as compared with Example 3, and it is therefore possible to further improve light emission efficiency of the fluorescent emission layer 34 as compared with Example 3.

In Example 4, the example case has been described in which the fluorescent emission layer 34 contains two materials. Note, however, that the exciton generating layer 33 can of course contain two materials, as described in Embodiment 1.

Example 5

An organic EL element 10 in accordance with Example 5 is substantially identical with the organic EL element 10 in accordance with Example 4, except that 4CzIPN is used as the fluorescent emission material instead of TTPA in Example 4.

In Embodiment 3, the followings are materials and thicknesses of the layers stacked on the substrate 1 which is a glass substrate.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (10 nm) Fluorescent emission layer 34: mCP/4CzIPN (mCP/4CzIPN mixture ratio=0.9/0.1) (5 nm)

Exciton generating layer 33: ACRXTN (5 nm) Electron transfer layer 35: Bphen (40 nm)

Electron injection layer 36: LiF (1 nm) Second electrode 4 (cathode): Ag—Mg alloy (Ag/Mg mixture ratio=0.9/0.1) (20 nm)

As described in Embodiment 1, the fluorescent emission layer 34 can contain, for example, a TADF material (TADF dopant material) as the fluorescent emission material. As early described, 4CzIPN is a thermally activated delayed fluorescent substance which emits green light.

A location at which excitons are generated is determined based on a carrier balance, not on a material, and therefore excitons are generated in the exciton generating layer 33 in Example 5, as with Example 4.

In addition to this, in Example 5, the TADF material (TADF dopant material) is used as the fluorescent emission material, and the TADF material in the fluorescent emission layer 34 is partially excited directly, and thus light is emitted. It is therefore possible to improve light emission efficiency.

Embodiment 4

The following description will discuss still another embodiment of the present invention with reference to FIG. 5.

Note that, in Embodiment 4 also, a difference from Embodiment 1 will be described. The same reference numerals are given to constituent elements which have functions identical with those described in Embodiment 1, and such constituent elements will not be repeatedly described. Moreover, it is of course possible to alter Embodiment 4 in a manner similar to that in Embodiments 1 through 3.

<Schematic Configuration of Organic EL Element 10>

FIG. 5 is a cross-sectional view illustrating a schematic configuration of an organic EL element 10 in accordance with Embodiment 4.

Note that, in Embodiment 4 also, an example case is illustrated in which a first electrode 2 serves as an anode, and a second electrode 4 serves as a cathode.

As above described, the organic EL layer 3 at least includes at least one layer of an exciton generating layer 33 and at least one layer of a fluorescent emission layer 34.

The organic EL layer 3 can include two or more fluorescent emission layers 34, and the fluorescent emission layers 34 can be laminated so as to sandwich the exciton generating layer 33.

In an organic EL element 10 illustrated in FIG. 5, fluorescent emission layers 34 are laminated so as to respectively make contact with both front and back surfaces (i.e., a first main surface and a second main surface) of an exciton generating layer 33.

In the following description, in a case where those fluorescent emission layers 34 need to be distinguished, the fluorescent emission layers 34 are referred to as "first fluorescent emission layer 34A" and "second fluorescent emission layer 34B", respectively.

That is, in the organic EL element 10 illustrated in FIG. 5, the organic EL layer 3, which is provided between the first electrode 2 and the second electrode 4, includes a hole injection layer 31, a hole transfer layer 32, a first fluorescent emission layer 34A, an exciton generating layer 33, a second fluorescent emission layer 34B, an electron transfer layer 35, and an electron injection layer 36 which are provided in this order from a first electrode 2 side.

Note that thicknesses of the respective fluorescent emission layers 34 can be identical or can be different. The thicknesses of the respective fluorescent emission layers 34 can be determined as appropriate in accordance with mobilities of the fluorescent emission layers 34 and a balance of mobilities of materials around the fluorescent emission layers 34.

<Effect>

According to Embodiment 4, the organic EL layer 3 includes two or more fluorescent emission layers 34 as above described, and it is therefore possible to improve light emission efficiency.

In particular, energy transfer from the exciton generating layer 33 can occur evenly on an anode side and a cathode side of the exciton generating layer 33. Therefore, in a case where the fluorescent emission layer 34 is provided between the exciton generating layer 33 and the anode and another fluorescent emission layer 34 is provided between the exciton generating layer 33 and the cathode, energy transfer to the fluorescent dopant material can occur without leakage, and this allows increase in light emission efficiency.

As above described, Forster transition from an S1 level of the TADF material to an S1 level of the fluorescent emission material occurs, provided that the TADF material and the fluorescent emission material are located within a certain distance. In a case where a distance from a molecule of the TADF material to a molecule of the fluorescent emission material is 10 nm or less, transfer efficiency is not impaired.

Therefore, according to Embodiment 4, in a case where a distance between the TADF material and a closer one of the first fluorescent emission layer 34A and the second fluorescent emission layer 34B (in other words, a shortest distance from an arbitrary location in the exciton generating layer 33 to the fluorescent emission layer 34) is 10 nm or less, Forster transition surely occurs as with a case where the TADF material and the fluorescent emission layer 34 are making contact with each other.

From this, in the configuration illustrated in FIG. 5, in a case where the thickness d1 (d=d1) of the exciton generating layer 33 is 20 nm or less, it is possible to set, to 10 nm or less, a distance from a molecule of the TADF material in the exciton generating layer 33 and a molecule of the fluorescent emission material in the closer one of the first fluorescent emission layer 34A and the second fluorescent emission layer 34B. In this case, therefore, the thickness d1 of the exciton generating layer 33 is preferably 20 nm or less.

The following description will specifically discuss a configuration of the organic EL element 10 in accordance with Embodiment 4 with reference to Example. In Example described below also, some constituent elements have specific dimensions and are made of specific materials. Note, however, that Embodiment 4 is also not limited only to the following Example.

Example 6

In Example 6, as illustrated in FIG. 5, a non-light-transmitting electrode 21, a light-transmitting electrode 22, a hole injection layer 31, a hole transfer layer 32, a first fluorescent emission layer 34A, an exciton generating layer 33, a second fluorescent emission layer 34B, an electron transfer layer 35, an electron injection layer 36, and a second electrode 4 are stacked in this order on a substrate 1.

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (20 nm)

First fluorescent emission layer 34A (fluorescent emission layer 34): mCP/TTPA (mCP/TTPA mixture ratio=0.9/0.1) (5 nm)

Exciton generating layer 33: ACRXTN (10 nm)

Second fluorescent emission layer 34B (fluorescent emission layer 34): mCBP/TTPA (mCBP/TTPA mixture ratio=0.9/0.1) (5 nm)

Electron transfer layer 35: Bphen (20 nm)

Electron injection layer 36: LiF (1 nm)

Second electrode 4 (cathode): Ag—Mg alloy (Ag/Mg mixture ratio=0.9/0.1) (20 nm)

According to Example 6, the fluorescent emission layer 34 is provided between the exciton generating layer 33 and the anode and another fluorescent emission layer 34 is provided between the exciton generating layer 33 and the cathode as above described, and this makes it possible to cause Forster transition to the fluorescent emission materials in both of the fluorescent emission layers 34. Therefore, light emission efficiency is increased as compared with Example 1.

Moreover, in Example 6, the film thickness of the exciton generating layer 33 is 10 nm. It is therefore possible to set, to 10 nm, a distance from a molecule of a TADF material in the exciton generating layer 33 which material is farthest from a fluorescent emission material to a molecule of a fluorescent emission material in the fluorescent emission layer 34 which material is nearest to a TADF material.

In Example 6, the film thickness of the exciton generating layer 33 is 10 nm. Note, however, that, in a case where the film thickness of the exciton generating layer 33 is 20 nm, it is possible to set, to 10 nm, a shortest distance from an arbitrary location in the exciton generating layer 33 to the fluorescent emission layer 34 (i.e., the first fluorescent emission layer 34A or the second fluorescent emission layer 34B).

In Example 6, mCP which is a positive hole transferable material is mixed, as a host material, in the first fluorescent emission layer 34A which is on the anode side, and mCBP which is an electron transferable material is mixed, as a host material, in the second fluorescent emission layer 34B which is on the cathode side. From this, positive hole transferability and electron transferability to the exciton generating layer 33 are heightened, and carriers are more likely to gather in the exciton generating layer 33. Therefore, according to Example 6, it is possible to further improve efficiency of generating excitons.

Moreover, as early described, an S1 level and a T1 level of mCP are higher than respective S1 level and T1 level of ACRXTN and higher than respective S1 level and T1 level of TTPA, and an S1 level and a T1 level of mCBP are higher than the respective S1 level and T1 level of ACRXTN and the respective S1 level and T1 level of TTPA. Therefore, even in a case where each of the fluorescent emission layers 34 contains mCP or mCBP as above described, energy is not transferred to mCP and mCBP.

Moreover, as early described, ACRXTN and TTPA have the following relations: S1 level of ACRXTN>S1 level of TTPA; and T1 level of ACRXTN>T1 level of TTPA, and also have the following relations: HOMO level of ACRXTN>HOMO level of TTPA; and LUMO level of ACRXTN<LUMO level of TTPA.

From this, Example 6 can also bring about an effect similar to that of Embodiment 1 or, for example, Example 4 of Embodiment 3.

Example 6 has been described based on the example case where the first fluorescent emission layer 34A and the second fluorescent emission layer 34B contain different host materials. Note, however, that Embodiment 4 is not limited to this and it is of course possible that the first fluorescent emission layer 34A and the second fluorescent emission layer 34B contain different fluorescent dopant materials (fluorescent emission materials). As such, it is possible to use different materials (e.g., different fluorescent emission materials or different host materials) in the first fluorescent emission layer 34A and the second fluorescent emission layer 34B so as to adjust carrier mobilities or to adjust an emitted light color.

Embodiment 5

The following description will discuss still another embodiment of the present invention with reference to FIG. 6.

Note that, in Embodiment 5, a difference from Embodiment 1 will be described. The same reference numerals are given to constituent elements which have functions identical with those described in Embodiment 1, and such constituent elements will not be repeatedly described. Moreover, it is of course possible to alter Embodiment 5 in a manner similar to that in Embodiments 1 through 4.

<Schematic Configuration of Organic EL Element 10>

FIG. 6 is a cross-sectional view illustrating a schematic configuration of an organic EL element 10 in accordance with Embodiment 5.

Note that, in Embodiment 5 also, an example case is illustrated in which a first electrode 2 serves as an anode, and a second electrode 4 serves as a cathode.

In a case where an electric current density is increased so that the organic EL element 10 emits light at a high luminance, a carrier recombination region may expand to the outside of the exciton generating layer 33 and excitons may be generated directly in the fluorescent dopant in the fluorescent emission layer 34, which dopant is made of a non-TADF material.

In view of this, in Embodiment 5, in order to inhibit decrease in light emission efficiency due to the above phenomenon, at least one layer other than the exciton generating layer 33 and the fluorescent emission layer 34 is provided as an intermediate layer 37 between the exciton generating layer 33 and the fluorescent emission layer 34. That is, the intermediate layer 37 can be one (1) layer or a plurality of layers.

The intermediate layer 37 is not particularly limited, provided that carriers and excitons can move in the layer and energy can be exchanged between the exciton generating layer 33 and the fluorescent emission layer 34. The intermediate layer 37 can be made of, for example, an electron transferable material and a positive hole transferable material. The electron transferable material or the positive hole transferable material can be, for example, the material of the electron transfer layer 35 or the material of the hole transfer layer 32. Note that the intermediate layer 37 can be made of one (1) material or a plurality of materials. For example, the intermediate layer 37 can be a layer made of a mixture of two or more materials or can be made up of layers respectively made of two or more materials.

A material of the intermediate layer 37 is not particularly limited and can be selected as appropriate in accordance with a carrier mobility of the exciton generating layer 33 and a balance between carrier mobilities of materials around the fluorescent emission layer 34, a type of a material constituting the fluorescent emission layer 34, and the like such that excitons are generated in the exciton generating layer 33.

<Effect>

As described in Example 1, in a case of a combination of the hole transfer layer 32 which is an α-NPD layer having a thickness of 20 nm and the electron transfer layer 35 which is a Bphen layer having a thickness of 20 nm, electron transferability is higher than positive hole transferability. Therefore, electrons and positive holes are more likely to recombine on the anode side, rather than on the cathode side.

From this, in this case, excitons can be efficiently generated in the exciton generating layer 33 by providing the exciton generating layer 33 so as to be closer to the anode side than the fluorescent emission layer 34 is.

In this case, carriers are more likely to gather in the exciton generating layer 33, provided that the intermediate layer 37 is made of an electron transferable material. Moreover, in this case, carriers are further more likely to gather in the exciton generating layer 33, provided that an electron transferable material is used as a host material in the fluorescent emission layer 34.

Note that, for example, in a case where positive hole transferability is higher than electron transferability as in Embodiment 3, it is preferable to provide the exciton generating layer 33 so as to be closer to the cathode side than the fluorescent emission layer 34 is, and the intermediate layer 37 is made of a positive hole transferable material. In this case, it is more preferable that a positive hole transferable material is used as a host material of the fluorescent emission layer 34. This allows carriers to further gather in the exciton generating layer 33.

According to Embodiment 5, the intermediate layer 37 is thus provided between the exciton generating layer and the fluorescent emission layer 34 so that the exciton generating layer 33 and the fluorescent emission layer 34 are not consecutively laminated. This makes it possible to prevent excitons from being generated directly in the fluorescent emission layer 34 when light is emitted at a high luminance (that is, an electric current density is increased so as to cause the organic EL element 10 to emit light at a high luminance), and accordingly light emission efficiency can be improved.

In a case where the organic EL layer 3 includes the intermediate layer 37 which is provided between the exciton generating layer 33 and the fluorescent emission layer 34, it is preferable that an S1 level and a T1 level of each of all materials in the intermediate layer 37 are higher than respective S1 level and T1 level of each of all fluorescent dopant materials (fluorescent emission materials) in the fluorescent emission layer 34, and it is more preferable that the S1 level and a T1 level of each of all materials in the intermediate layer 37 are higher than respective S1 level and T1 level of each of all TADF materials in the exciton generating layer 33. This makes it possible to prevent energy from being transferred to the materials of the intermediate layer 37.

Moreover, in a case where the organic EL layer 3 includes the intermediate layer 37 which is provided between the exciton generating layer 33 and the fluorescent emission layer 34, it is preferable that a HOMO level of each of materials in the intermediate layer 37 is lower than a HOMO level of the TADF material in the exciton generating layer 33, and a LUMO level of each of the materials in the intermediate layer 37 is higher than a LUMO level of the TADF material in the exciton generating layer 33. From this, positive holes and electrons are more likely to enter the exciton generating layer 33, rather than the intermediate layer 37. As a result, exciton generation probability in the exciton generating layer 33 is improved, and it is therefore possible to improve light emission efficiency.

It is preferable that the HOMO level of each of all the materials in the intermediate layer 37 is higher than a HOMO level of the fluorescent dopant material (fluorescent emission material) in the fluorescent emission layer 34, and the LUMO level of each of all the materials in the intermediate layer 37 is lower than a LUMO level of the fluorescent dopant material (fluorescent emission material) in the fluorescent emission layer 34. From this, positive holes and electrons are more likely to enter the intermediate layer 37, rather than the fluorescent emission layer 34. As a result, exciton generation probability in the exciton generating layer 33 is improved, and it is therefore possible to improve light emission efficiency.

Therefore, by combining the above described configurations, exciton generation probability in the exciton generating layer 33 is further improved, and it is therefore possible to further improve light emission efficiency.

In a case where the organic EL layer 3 thus includes the intermediate layer 37 which is provided between the exciton generating layer 33 and the fluorescent emission layer 34, it is preferable that a total of the thickness d1 of the exciton generating layer 33 and a thickness d2 of the intermediate layer 37 is 10 nm or less.

In a case where d1+d2 is 10 nm or less, as illustrated in FIG. 6, it is possible to set the distance d to 10 nm or less, which distance d is a distance from a molecule of a TADF material in the exciton generating layer 33 which material is farthest from a fluorescent emission material (i.e., a molecule of a TADF material located in a surface of the exciton generating layer 33 which surface is opposite to the fluorescent emission layer 34) to a molecule of a fluorescent emission material of the fluorescent emission layer 34 which material is nearest to a TADF material (i.e., a molecule of a fluorescent emission material located in a surface of the fluorescent emission layer 34 which surface is on the exciton generating layer 33 side).

The following description will specifically discuss a configuration of the organic EL element 10 in accordance with Embodiment 5 with reference to Example. In Example described below also, some constituent elements have specific dimensions and are made of specific materials. Note, however, that Embodiment 5 is also not limited only to the following Example.

Example 7

In Example 7, as illustrated in FIG. 6, a non-light-transmitting electrode 21, a light-transmitting electrode 22, a hole injection layer 31, a hole transfer layer 32, an exciton generating layer 33, an intermediate layer 37, a fluorescent emission layer 34, an electron transfer layer 35, an electron injection layer 36, and a second electrode 4 are stacked in this order on a substrate 1.

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (20 nm)

Exciton generating layer 33: ACRXTN (5 nm)

Intermediate layer 37: mCBP (2 nm)

Fluorescent emission layer 34: mCBP/TTPA (mCBP/TTPA mixture ratio=0.9/0.1) (5 nm)

Electron transfer layer 35: Bphen (20 nm)

Electron injection layer 36: LiF (1 nm)

Second electrode 4 (cathode): Ag—Mg alloy (Ag/Mg mixture ratio=0.9/0.1) (20 nm)

In Example 7, as illustrated in FIG. 6, the exciton generating layer 33 is provided so as to be closer to the anode side than the fluorescent emission layer 34 is, and the intermediate layer 37 made of mCBP which is an electron transferable material is provided between the exciton generating layer 33 and the fluorescent emission layer 34. Moreover, mCBP is mixed in the fluorescent emission layer 34 as an electron transferable host material.

Therefore, according to Embodiment 5, it is possible to prevent excitons from being directly generated in the fluorescent emission layer 34 even during light emission at a high luminance, and it is therefore possible to improve light emission efficiency.

Moreover, in Example 7, relations of an S1 level and a T1 level of ACRXTN, TTPA, and mCBP, and relations of a HOMO level and a LUMO level of ACRXTN and TTPA are, for example, identical with those described in Embodiments 1, 3, and 4.

As such, in Example 7 also, an S1 level of the TADF material (ACRXTN in Example 7) in the exciton generating layer 33 is higher than an S1 level of the fluorescent dopant material (fluorescent emission material, TTPA in Example 7) in the fluorescent emission layer 34, and a T1 level of the TADF material in the exciton generating layer 33 is higher than a T1 level of the fluorescent dopant material (fluorescent emission material) in the fluorescent emission layer 34.

Moreover, a HOMO level of the TADF material in the exciton generating layer 33 is higher than a HOMO level of the fluorescent dopant material (fluorescent emission material) in the fluorescent emission layer 34, and a LUMO level of the TADF material in the exciton generating layer 33 is lower than a LUMO level of the fluorescent dopant material (fluorescent emission material) in the fluorescent emission layer 34.

Moreover, an S1 level and a T1 level of mCBP are higher than respective S1 level and T1 level of ACRXTN and respective S1 level and T1 level of TTPA.

Therefore, the S1 level and the T1 level of each of all materials (mCBP in Example 7) in the fluorescent emission layer 34 which materials are different from the fluorescent dopant material (fluorescent emission material) are (i) higher than the respective S1 level and T1 level of the TADF material in the exciton generating layer 33 and (ii) higher than the respective S1 level and T1 level of the fluorescent dopant material (fluorescent emission material) in the fluorescent emission layer 34.

Therefore, Example 7 can also bring about an effect similar to, for example, those described in Embodiment 1 and Example 4 of Embodiment 3.

In addition to this, in Example 7, the S1 level and the T1 level of each of the materials (mCBP in Example 7) in the intermediate layer 37 are also higher than the respective S1 level and T1 level of the TADF material in the exciton generating layer 33 and the respective S1 level and the T1 level of the fluorescent dopant material (fluorescent emission material) in the fluorescent emission layer 34. It is therefore possible to prevent energy from being transferred to the materials of the intermediate layer 37.

The HOMO level of mCBP is lower than the HOMO level of ACRXTN, and the LUMO level of mCBP is higher than the LUMO level of ACRXTN. Further, the HOMO level of mCBP is higher than the HOMO level of TTPA, and the LUMO level of mCBP is lower than the LUMO level of TTPA.

Therefore, the HOMO level of each of all the materials in the intermediate layer 37 is lower than the HOMO level of the TADF material in the exciton generating layer 33, and the LUMO level of each of all the materials in the intermediate layer 37 is higher than the LUMO level of the TADF material in the exciton generating layer 33.

Further, the HOMO level of each of all the materials in the intermediate layer 37 is higher than the HOMO level of the fluorescent dopant material (fluorescent emission material) in the fluorescent emission layer 34, and the LUMO level of each of all the materials in the intermediate layer 37 is lower than the LUMO level of the fluorescent dopant material (fluorescent emission material) in the fluorescent emission layer 34.

Therefore, according to Example 7, it is possible to improve exciton generation probability in the exciton generating layer 33, and accordingly light emission efficiency can be improved.

Embodiment 6

The following description will discuss still another embodiment of the present invention with reference to FIG. 7.

Note that, in Embodiment 6, a difference mainly from Embodiments 4 and 5 will be described. The same reference numerals are given to constituent elements which have functions identical with those described in Embodiments 4 and 5, and such constituent elements will not be repeatedly described. Moreover, it is of course possible to alter Embodiment 6 in a manner similar to that in Embodiments 1 through 5.

<Schematic Configuration of Organic EL Element 10>

FIG. 7 is a cross-sectional view illustrating a schematic configuration of an organic EL element 10 in accordance with Embodiment 6.

Note that, in Embodiment 6 also, an example case is illustrated in which a first electrode 2 serves as an anode, and a second electrode 4 serves as a cathode.

In a case where the first fluorescent emission layer 34A and the second fluorescent emission layer 34B are provided so as to sandwich the fluorescent emission layer 34 as in Embodiment 4, the intermediate layer 37 can be provided at one of locations between the first fluorescent emission layer 34A and the exciton generating layer 33 and between the second fluorescent emission layer 34B and the exciton generating layer 33, or at both of the locations.

In a case where the intermediate layers 37 need to be distinguished, the intermediate layers 37 are hereinafter referred to as "first intermediate layer 37A" and "second intermediate layer 37B", respectively.

Note that each of the first intermediate layer 37A and the second intermediate layer 37B can be one (1) layer or can be a plurality of layers. Moreover, each of the intermediate layers 37 can be made of one (1) material or can be made of a plurality of materials, as with Embodiment 5.

<Effect>

According to Embodiment 6, in any of the cases, the intermediate layer 37 is provided between the fluorescent emission layer 34 and the exciton generating layer 33, and it is therefore possible to bring about an effect similar to that of Embodiment 5.

In a case where the first fluorescent emission layer 34A and the second fluorescent emission layer 34B are provided so as to sandwich the fluorescent emission layer 34 as above described, it is preferable that a distance between a molecule of the TADF material in the exciton generating layer 33 and a molecule of the fluorescent emission material in closer one of the first fluorescent emission layer 34A and the second fluorescent emission layer 34B is 10 nm or less, as with Embodiment 4.

Therefore, for example, in a case where the intermediate layer 37 is provided between the first fluorescent emission layer 34A and the exciton generating layer 33 and another intermediate layer 37 is provided between the second fluorescent emission layer 34B and the exciton generating layer 33 as above described, a total (d1+d21+d22) of the thickness d1 of the exciton generating layer 33, a thickness d21 of the first intermediate layer 37A, and a thickness d22 of the second intermediate layer 37B is preferably 20 nm or less. This makes it possible to set a shortest distance from an arbitrary location in the exciton generating layer 33 to the fluorescent emission layer 34 to be 10 nm or less.

Note that the intermediate layers 37 can have identical thicknesses or different thicknesses. The thicknesses of the intermediate layers 37 can be set as appropriate in accordance with a balance between mobilities of materials around the intermediate layers 37.

The following description will specifically discuss a configuration of the organic EL element 10 in accordance with Embodiment 6 with reference to Example. In Example described below also, some constituent elements have specific dimensions and are made of specific materials. Note, however, that Embodiment 6 is also not limited only to the following Example.

Example 8

In Example 8, as illustrated in FIG. 7, a non-light-transmitting electrode 21, a light-transmitting electrode 22, a hole injection layer 31, a hole transfer layer 32, a first fluorescent emission layer 34A, a first intermediate layer 37A, an exciton generating layer 33, a second intermediate layer 37B, a second fluorescent emission layer 34B, an electron transfer layer 35, an electron injection layer 36, and a second electrode 4 are stacked in this order on a substrate 1.

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (20 nm)

First fluorescent emission layer 34A (fluorescent emission layer 34): mCP/TTPA (mCP/TTPA mixture ratio=0.9/0.1) (5 nm)

First intermediate layer 37A (intermediate layer 37): mCP (2 nm)

Exciton generating layer 33: ACRXTN (5 nm)

Second intermediate layer 37B (intermediate layer 37): mCBP (2 nm)

Second fluorescent emission layer 34B (fluorescent emission layer 34): mCBP/TTPA (mCBP/TTPA mixture ratio=0.9/0.1) (5 nm)

Electron transfer layer 35: Bphen (20 nm)

Electron injection layer 36: LiF (1 nm)

Second electrode 4 (cathode): Ag—Mg alloy (Ag/Mg mixture ratio=0.9/0.1) (20 nm)

In Example 8, as illustrated in FIG. 7, the first intermediate layer 37A which is made of a positive hole transferable material (i.e., mCP) is provided between the exciton generating layer 33 and the first fluorescent emission layer 34A which is the fluorescent emission layer 34 on the anode side. Moreover, mCP is mixed in the first fluorescent emission layer 34A as a positive hole transferable host material. Further, in Example 8, the second intermediate layer 37B which is made of an electron transferable material (i.e., mCBP) is provided between the exciton generating layer 33 and the second fluorescent emission layer 34B which is the fluorescent emission layer 34 on the cathode side. Moreover, mCBP is mixed in the second fluorescent emission layer 34B as an electron transferable host material.

Moreover, relations of an S1 level and a T1 level of each of ACRXTN, TTPA, and mCBP, and relations of a HOMO level and a LUMO level of each of ACRXTN, TTPA, and mCBP are, for example, identical with those described in Embodiments 1 and 3 through 5.

Moreover, relations of an S1 level and a T1 level of each of ACRXTN, TTPA, and mCP are, for example, identical with those described in Embodiments 3 and 5.

Further, the HOMO level of mCP is lower than the HOMO level of ACRXTN, and the LUMO level of mCP is higher than the LUMO level of ACRXTN. Further, the HOMO level of mCP is higher than the HOMO level of TTPA, and the LUMO level of mCP is lower than the LUMO level of TTPA.

Therefore, in Example 8 also, relations of the S1 level, T1 level, HOMO level, and LUMO level of the TADF material in the exciton generating layer 33, the S1 level, T1 level, HOMO level, and LUMO level of the fluorescent dopant material (fluorescent emission material, TTPA) in the fluorescent emission layer 34, the S1 level, T1 level, HOMO level, and LUMO level of all materials (mCP and mCBP in Example 8) other than the fluorescent dopant material (fluorescent emission material, TTPA) in the fluorescent emission layer 34, and the S1 level, T1 level, HOMO level, and LUMO level of all the materials (mCP and mCBP in Example 8) in the intermediate layers 37 are, for example, identical with those described in Embodiments 4 and 5.

Therefore, according to Example 8, it is possible to bring about an effect similar to those described in Embodiments 4 and 5.

Embodiment 7

The following description will discuss still another embodiment of the present invention with reference to FIG. 8.

Note that, in Embodiment 7, a difference mainly from Embodiment 4 will be described. The same reference numerals are given to constituent elements which have functions identical with those described in Embodiment 4, and such constituent elements will not be repeatedly described. Moreover, it is of course possible to alter Embodiment 7 in a manner similar to those in Embodiments 1 through 6.

<Schematic Configuration of Organic EL Element 10>

FIG. 8 is a cross-sectional view illustrating a schematic configuration of an organic EL element 10 in accordance with Embodiment 7.

Note that, in Embodiment 7 also, an example case is illustrated in which a first electrode 2 serves as an anode, and a second electrode 4 serves as a cathode.

In a case where the thickness of the fluorescent emission layer 34 is less than 10 nm, the energy is transferred from the exciton generating layer 33 beyond the fluorescent emission layer 34 to an outer side layer of the fluorescent emission layer 34, and light emission efficiency may be decreased. Note that the outer side layer is a layer provided opposite to the exciton generating layer 33 across the fluorescent emission layer 34 in the organic EL layer 3, and can be, for example, the hole transfer layer 32, the electron transfer layer 35, or the like.

Therefore, in a case where the thickness of the fluorescent emission layer 34 is less than 10 nm, it is preferable to provide a block layer 38 adjacently to the fluorescent emission layer 34 for preventing Forster transition to the outer side layer.

The block layer 38 serves as a layer for blocking exciton energy transfer. The block layer 38 is not particularly limited, provided that the block layer 38 has a film thickness enough to prevent energy transfer from the exciton generating layer 33 to a peripheral layer on the outer side. For example, the block layer 38 can be made of an electron transferable material or a positive hole transferable material. The electron transferable material or the positive hole transferable material can be, for example, the material of the electron transfer layer 35 or the material of the hole transfer layer 32. Note that the block layer 38 can be made of one (1) material or a plurality of materials.

<Effect>

According to Embodiment 7, the block layer 38 is provided. Therefore, even in a case where the thickness of the fluorescent emission layer 34 is small, it is possible to prevent energy from being transferred from the exciton generating layer 33 beyond the fluorescent emission layer 34 to the peripheral layer on the outer side. Therefore, according to Embodiment 7, it is possible to improve light emission efficiency even in a case where the thickness of the fluorescent emission layer 34 is small.

Note that, in the block layer 38, it is preferable that both S1 level and T1 level are higher than respective S1 level and T1 level of each of all fluorescent emission materials (fluorescent dopant materials) in the adjacent fluorescent emission layer 34, and it is more preferable that both S1 level and T1 level are higher than respective S1 level and T1 level of each of all TADF materials in the exciton generating layer 33. That is, it is more preferable that the block layer 38 is made of a material whose S1 level and T1 level are both higher than the respective S1 level and T1 level of each of all the fluorescent emission materials (fluorescent dopant materials) in the adjacent fluorescent emission layer 34 and the respective S1 level and T1 level of each of all the TADF materials in the exciton generating layer 33. This makes it possible to prevent energy transfer from the exciton generating layer 33 and the fluorescent emission layer 34 to the block layer 38.

Moreover, a HOMO level of each of all materials in the block layer 38 is preferably lower than a HOMO level of the fluorescent emission material (fluorescent dopant material) in the adjacent fluorescent emission layer 34. In this case, positive holes are more likely to enter the fluorescent emission layer 34 rather than the block layer 38, and it is therefore possible to prevent leakage of positive holes. From this, exciton generation probability in the exciton generating layer 33 is improved, and it is therefore possible to improve light emission efficiency.

Moreover, a LUMO level of each of all the materials in the block layer 38 is preferably higher than a LUMO level of the fluorescent emission material (fluorescent dopant material) in the adjacent fluorescent emission layer 34. In this case, electrons are more likely to enter the fluorescent emission layer 34 rather than the block layer 38, and it is therefore possible to prevent leakage of electrons. From this, exciton generation probability in the exciton generating layer 33 is improved, and it is therefore possible to improve light emission efficiency.

In a case where the first fluorescent emission layer 34A and the second fluorescent emission layer 34B are provided as illustrated in FIG. 8, the block layer 38 can be provided any one of or both of locations between the first fluorescent emission layer 34A and the hole transfer layer 32, and between the second fluorescent emission layer 34B and the electron transfer layer 35.

In a case where the block layers 38 need to be distinguished, the block layers 38 are hereinafter referred to as "first block layer 38A" and "second block layer 38B", respectively.

As illustrated in FIG. 8, in a case where the first block layer 38A is provided between the first fluorescent emission layer 34A and the hole transfer layer 32, and the second block layer 38B is provided between the second fluorescent emission layer 34B and the electron transfer layer 35, a total thickness of the first fluorescent emission layer 34A and the first block layer 38A, and a total thickness of the second block layer 38B and the second block layer 38B are both preferably 10 nm or more. This makes it possible to further surely prevent a case where energy is transferred to outer side layers of the block layers 38 and thus light emission efficiency is decreased.

Note that an upper limit of the total thickness of the first fluorescent emission layer 34A and the first block layer 38A and an upper limit of the total thickness of the second block layer 38B and the second block layer 38B are not particularly limited. However, in a case where thicknesses of layers are increased and the number of layers is increased, a thickness of the organic EL element 10 which is ultimately obtained is accordingly increased. Therefore, in view of a relation with the other layers, those upper limits are preferably determined as appropriate such that the organic EL element 10 has an intended thickness. Each of the upper limits is, for example, preferably 50 nm or less in order to prevent increase in driving voltage.

Note that the block layers 38 can have identical thicknesses or different thicknesses. The thicknesses of the block layers 38 can be determined as appropriate in accordance with a mobility of the adjacent fluorescent emission layer 34 or the like.

The following description will specifically discuss a configuration of the organic EL element 10 in accordance with Embodiment 7 with reference to Example. In Example described below also, some constituent elements have specific dimensions and are made of specific materials. Note, however, that Embodiment 7 is also not limited only to the following Example.

Example 8

In Example 8, as illustrated in FIG. 8, a non-light-transmitting electrode 21, a light-transmitting electrode 22, a hole injection layer 31, a hole transfer layer 32, a first block layer 38A, a first fluorescent emission layer 34A, an exciton generating layer 33, a second fluorescent emission layer 34B, a second block layer 38B, an electron transfer layer 35, an electron injection layer 36, and a second electrode 4 are stacked in this order on a substrate 1.

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (20 nm)

First block layer 38A (block layer 38): mCP (10 nm)

First fluorescent emission layer 34A (fluorescent emission layer 34): mCP/TTPA (mCP/TTPA mixture ratio=0.9/0.1) (5 nm)

Exciton generating layer 33: ACRXTN (10 nm)

Second fluorescent emission layer 34B (fluorescent emission layer 34): mCBP/TTPA (mCBP/TTPA mixture ratio=0.9/0.1) (5 nm)

Second block layer 38B (block layer 38): mCBP (10 nm)

Electron transfer layer 35: Bphen (20 nm)

Electron injection layer 36: LiF (1 nm)

Second electrode 4 (cathode): Ag—Mg alloy (Ag/Mg mixture ratio=0.9/0.1) (20 nm)

In Example 8, the block layer 38 which is made of mCP or mCBP is provided between the fluorescent emission layer 34 and a peripheral layer which is located on the outer side (i.e., electrode side).

Note that relations of S1 level, T1 level, HOMO level, and LUMO level of each of ACRXTN, TTPA, mCP, and mCBP are, for example, identical with those described in Embodiments 1 and 3 through 6.

Therefore, according to Example 8, it is possible to bring about an effect similar to the effects described in Embodiments 1 and 3 through 6.

Moreover, according to Example 8, since the block layer 38 is provided, even in a case where the thickness of the fluorescent emission layer 34 is small as above described, the block layer 38 can prevent energy from being transferred from the exciton generating layer 33 to the peripheral layer on the outer side beyond the fluorescent emission layer 34. Therefore, in Embodiment 7 also, it is possible to improve light emission efficiency.

Modification Example

As above described, Embodiment 7 can be altered in a manner similar to those of Embodiments 1 through 6. Embodiment 7 has been described based mainly on the difference from Embodiment 4. However, for example, it is possible to employ a configuration in which the block layer 38 is provided at at least one of locations between the first fluorescent emission layer 34A and the hole transfer layer 32 and between the second fluorescent emission layer 34B and the electron transfer layer 35 in the organic EL element 10 illustrated in FIG. 7.

Embodiment 8

The following description will discuss still another embodiment of the present invention with reference to FIG. 9.

Note that, in Embodiment 8, a difference mainly from Embodiment 1 will be described. The same reference numerals are given to constituent elements which have functions identical with those described in Embodiment 1, and such constituent elements will not be repeatedly described. Moreover, it is of course possible to alter Embodiment 8 in a manner similar to those in Embodiments 1 through 7.

<Schematic Configuration of Organic EL Element 10>

FIG. 9 is a cross-sectional view illustrating a schematic configuration of an organic EL element 10 in accordance with Embodiment 8.

Note that, in Embodiment 8 also, an example case is illustrated in which a first electrode 2 serves as an anode, and a second electrode 4 serves as a cathode.

In a case where the organic EL element 10 is driven by changing an electric current density, a location at which excitons are generated may be changed.

In view of this, the exciton generating layers 33 can be provided on both a front surface side and a back surface side of the fluorescent emission layer 34 as illustrated in FIG. 9.

That is, the exciton generating layers 33 can be provided at both locations between the fluorescent emission layer 34 and the first electrode 2 and between the fluorescent emission layer 34 and the second electrode 4.

In a case where the exciton generating layers 33 need to be distinguished, the exciton generating layers 33 are hereinafter referred to as "first exciton generating layer 33A" and "second exciton generating layer 33B", respectively.

As such, in a case where the plurality of exciton generating layers 33 are provided in the organic EL layer 3, a TADF material in the first exciton generating layer 33A and a TADF material in the second exciton generating layer 33B can be identical materials or can be different materials.

In a case where the first exciton generating layer 33A and the second exciton generating layer 33B are made of different TADF materials, it is possible to make carrier mobilities of the exciton generating layers 33 different. In this case, therefore, it is possible to adjust the location, at which excitons are generated, in accordance with an electric current density which is changed when the organic EL element 10 is driven. From this, carriers are more likely to recombine in the exciton generating layers 33, and accordingly light emission efficiency is improved.

In a case where the first exciton generating layer 33A and the second exciton generating layer 33B are made of different TADF materials as above described, the TADF material in the first exciton generating layer 33A is preferably a material in which an electron mobility is higher than a positive hole mobility. In contrast, the TADF material in the second exciton generating layer 33B is preferably a material in which a positive hole mobility is higher than an electron mobility.

Note that, in the configuration illustrated in FIG. 9, a thickness d11 of the first exciton generating layer 33A and a thickness d12 of the second exciton generating layer 33B are both preferably 10 nm or less. In this case, Forster transition surely occurs as with the case where both materials are making contact with each other, and transfer efficiency is not impaired.

Note that the thicknesses d11 and d12 can be identical thicknesses or can be different thicknesses. The thickness of each of the exciton generating layers 33 can be determined as appropriate in accordance with a mobility of each of the exciton generating layers 33 and a balance of mobilities of materials around the exciton generating layers 33.

<Effect>

By thus providing the exciton generating layers 33 so as to sandwich the fluorescent emission layer 34, carriers are more likely to recombine in the exciton generating layers 33 even when the organic EL element 10 is driven under different electric current conditions, and accordingly light emission efficiency is improved.

Moreover, according to Embodiment 8, the exciton generating layers 33 are provided so as to sandwich the fluorescent emission layer 34, and therefore energy is hardly transferred beyond the fluorescent emission layer 34 to the hole transfer layer 32 or the electron transfer layer 35 which are provided on respective outer sides, even in a case where the thickness of the fluorescent emission layer 34 is small. Therefore, the organic EL element 10 is suitable also in a case where the thickness of the fluorescent emission layer 34 is 10 nm or less.

The following description will specifically discuss a configuration of the organic EL element 10 in accordance with Embodiment 8 with reference to Example. In Example described below also, some constituent elements have specific dimensions and are made of specific materials. Note, however, that Embodiment 8 is also not limited only to the following Example.

Example 10

In Example 10, as illustrated in FIG. 9, a non-light-transmitting electrode 21, a light-transmitting electrode 22, a hole injection layer 31, a hole transfer layer 32, a first exciton generating layer 33A, a fluorescent emission layer 34, a second exciton generating layer 33B, an electron transfer layer 35, an electron injection layer 36, and a second electrode 4 are stacked in this order on a substrate 1.

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (20 nm)

First exciton generating layer 33A (exciton generating layer 33): ACRXTN (5 nm)

Fluorescent emission layer 34: TTPA (2 nm)

Second exciton generating layer 33B (exciton generating layer 33): ACRXTN (5 nm)

Electron transfer layer 35: Bphen (20 nm)

Electron injection layer 36: LiF (1 nm)

Second electrode 4 (cathode): Ag—Mg alloy (Ag/Mg mixture ratio=0.9/0.1) (20 nm)

Note that relations of S1 level, T1 level, HOMO level, and LUMO level of each of ACRXTN and TTPA are, for example, identical with those described in Embodiment 1.

Therefore, according to Example 10, it is possible to bring about an effect similar to the effect described in Embodiment 1.

Moreover, according to Example 10, the exciton generating layers 33 are provided so as to sandwich the fluorescent emission layer 34 as above described, and therefore carriers are more likely to recombine in the exciton generating layer 33 even when the organic EL element 10 is driven under different electric current conditions, and accordingly light emission efficiency is improved.

In Example 10, the example case is described in which the first exciton generating layer 33A and the second exciton generating layer 33B are both made of ACRXTN. Note, however, that it is possible to use ACRSA or PXZ-TRZ for one of the exciton generating layers 33, e.g., the first exciton generating layer 33A. In a case where TTPA is used as a fluorescent emission material as above described, it is particularly preferable to use ACRSA from the viewpoint of combination with the fluorescent emission material.

Modification Example

As above described, Embodiment 8 can be altered in a manner similar to those of Embodiments 1 through 7. Embodiment 8 has been described based on the difference mainly from Embodiment 1. However, it is possible to similarly modify any of the organic EL elements 10 described in the other embodiments and to similarly modify a combination of those organic EL elements 10.

For example, as described in Embodiments 5 through 7, it is possible to provide at least one intermediate layer 37 between each of the exciton generating layers 33 and the fluorescent emission layer 34.

Therefore, it is possible to provide at least one intermediate layer 37 at at least one of locations between the fluorescent emission layer 34 and the first exciton generating layer 33A and between the fluorescent emission layer 34 and the second exciton generating layer 33B.

Moreover, for example, as described in Embodiment 4, energy transfer from the exciton generating layer 33 can occur evenly on the anode side and the cathode side of the exciton generating layer 33. Therefore, in a case where the fluorescent emission layers 34 are provided so as to sandwich the exciton generating layer 33, energy transfer to the fluorescent dopant material can occur without leakage, and this allows increase in light emission efficiency.

Therefore, the organic EL layer 3 can include another fluorescent emission layer 34 provided at at least one of locations between the first exciton generating layer 33A and the anode and between the second exciton generating layer 33B and the cathode.

That is, the organic EL layer 3 can have a configuration which includes, for example, a first fluorescent emission layer 34A, a second fluorescent emission layer 34B, and a third fluorescent emission layer 34C, and in which the fluorescent emission layers 34 and the exciton generating layers 33 are stacked in the following order: first fluorescent emission layer 34A/first exciton generating layer 33A/second fluorescent emission layer 34B/second exciton generating layer 33B/third fluorescent emission layer 34C.

Moreover, in this case also, it is of course possible to provide at least one intermediate layer 37 at at least one of locations between the first fluorescent emission layer 34A and the first exciton generating layer 33A, between the first exciton generating layer 33A and the second fluorescent emission layer 34B, between the second fluorescent emission layer 34B and the second exciton generating layer 33B, and between the second exciton generating layer 33B and the third fluorescent emission layer 34C.

Embodiment 9

The following description will discuss still another embodiment of the present invention with reference to FIG. 10.

Note that, in Embodiment 9, a difference mainly from Embodiment 8 will be described. The same reference numerals are given to constituent elements which have functions identical with those described in Embodiment 1, and such constituent elements will not be repeatedly described. Moreover, it is of course possible to alter Embodiment 9 in a manner similar to those in Embodiments 1 through 8.

<Schematic Configuration of Organic EL Element 10>

FIG. 10 is a cross-sectional view illustrating a schematic configuration of an organic EL element 10 in accordance with Embodiment 9.

Note that, in Embodiment 9 also, an example case is illustrated in which a first electrode 2 serves as an anode, and a second electrode 4 serves as a cathode.

As illustrated in FIG. 9 of Embodiment 8, in a case where the exciton generating layers 33 are provided so as to sandwich the fluorescent emission layer 34 also, block layers 38 can be provided adjacently to the respective exciton generating layers 33 (see FIG. 10).

<Effect>

In Embodiment 9 also, by providing the block layers 38, it is possible to prevent energy from being transferred from the exciton generating layer 33 to peripheral layers other than the fluorescent emission layer 34, and accordingly light emission efficiency can be further improved.

A material of the block layer 38 can be a material similar to the material described in Embodiment 7. Note, however, that, in a case where the block layer 38 is thus provided adjacently to the exciton generating layer 33, the block layer 38 is preferably made of a material whose S1 level and T1 level are both higher than respective S1 level and T1 level of a TADF material in the adjacent exciton generating layer 33. That is, the block layer 38 is preferably made of a material whose S1 level and T1 level are both (i) higher than respective S1 level and T1 level of a TADF material in the adjacent exciton generating layer 33 and (ii) higher than respective S1 level and T1 level of a fluorescent emission material (fluorescent dopant material) in the fluorescent emission layer 34. This makes it possible to prevent energy transfer from the exciton generating layer 33 and the fluorescent emission layer 34 to the block layer 38.

Moreover, a HOMO level of each of all materials in the block layer 38 is preferably lower than a HOMO level of the TADF material in the adjacent exciton generating layer 33. In this case, positive holes are more likely to enter the fluorescent emission layer 34 rather than the block layer 38, and accordingly leakage of positive holes can be prevented. From this, exciton generation probability in the exciton generating layer 33 is improved, and it is therefore possible to improve light emission efficiency.

Moreover, a LUMO level of each of all materials in the block layer 38 is preferably higher than a LUMO level of the TADF material in the adjacent exciton generating layer 33. In this case, electrons are more likely to enter the fluorescent emission layer 34 rather than the block layer 38, and accordingly leakage of electrons can be prevented. From this, exciton generation probability in the exciton generating layer 33 is improved, and it is therefore possible to improve light emission efficiency.

Note that, in Embodiment 9 also, in a case where the first exciton generating layer 33A and the second exciton generating layer 33B are provided as illustrated in FIG. 10, the block layer 38 can be provided any one of or both of locations between the first exciton generating layer 33A and the hole transfer layer 32, and between the second exciton generating layer 33B and the electron transfer layer 35.

Note that a thickness of each of the block layers 38 is preferably 10 nm or more. This makes it possible to further surely prevent a case where energy is transferred to outer side layers of the block layers 38 and thus light emission efficiency is decreased.

Note that, also in Embodiment 9, an upper limit of the thickness of each of the block layers 38 is not particularly limited. However, in a case where thicknesses of layers are increased and the number of layers is increased, a thickness of the organic EL element 10 which is ultimately obtained is accordingly increased. Therefore, in view of a relation with the other layers, the upper limit is preferably determined as appropriate such that the organic EL element 10 has an intended thickness. The upper limit is, for example, preferably 50 nm or less in order to prevent increase in driving voltage.

Note that, in Embodiment 9 also, the block layers 38 can have identical thicknesses or different thicknesses. The thicknesses of the block layers 38 can be determined as appropriate in accordance with a mobility of the adjacent exciton generating layer 33 and the like.

Moreover, in Embodiment 9 also, each of the thicknesses d11 and d12 in the configuration illustrated in FIG. 10 is preferably 10 nm or less, as with the configuration illustrated in FIG. 9. Moreover, the thicknesses d11 and d12 can be identical thicknesses or different thicknesses.

The following description will specifically discuss a configuration of the organic EL element 10 in accordance with Embodiment 9 with reference to Example. In Example described below also, some constituent elements have specific dimensions and are made of specific materials. Note, however, that Embodiment 9 is also not limited only to the following Example.

Example 11

In Example 11, as illustrated in FIG. 10, a non-light-transmitting electrode 21, a light-transmitting electrode 22, a hole injection layer 31, a hole transfer layer 32, a first block layer 38A, a first exciton generating layer 33A, a fluorescent emission layer 34, a second exciton generating layer 33B, a second block layer 38B, an electron transfer layer 35, an electron injection layer 36, and a second electrode 4 are stacked in this order on a substrate 1.

The substrate 1 is a glass substrate. The followings are materials and thicknesses of the layers stacked on the substrate 1.

Non-light-transmitting electrode 21 (first electrode 2, anode, reflective electrode): Ag, 100 nm Light-transmitting electrode 22 (first electrode 2, anode): ITO, 30 nm Hole injection layer 31: HAT-CN (10 nm)

Hole transfer layer 32: α-NPD (20 nm)

First block layer 38A (block layer 38): mCP (10 nm)

First exciton generating layer 33A (exciton generating layer 33): ACRXTN (5 nm)

Fluorescent emission layer 34: TTPA (2 nm)

Second exciton generating layer 33B (exciton generating layer 33): ACRXTN (5 nm)

Second block layer 38B (block layer 38): mCBP (10 nm)

Electron transfer layer 35: Bphen (20 nm)

Electron injection layer 36: LiF (1 nm)

Second electrode 4 (cathode): Ag—Mg alloy (Ag/Mg mixture ratio=0.9/0.1) (20 nm)

Note that relations of S1 level, T1 level, HOMO level, and LUMO level of each of ACRXTN, TTPA, mCP, and mCBP are, for example, identical with those described in Embodiments 1 and 3 through 8.

According to Example 11, it is possible to bring about an effect similar to, for example, the effects described in Embodiments 7 and 8.

Modification Example

As above described, Embodiment 9 can be altered in a manner similar to those of Embodiments 1 through 8. Embodiment 9 has been described based mainly on the difference from Embodiment 8. However, it is possible to similarly modify any of the organic EL elements 10 described in the other embodiments and to similarly modify a combination of those organic EL elements 10.

For example, it is possible to provide a block layer 38 adjacently to the exciton generating layer 33 in any of the organic EL elements 10 illustrated in FIGS. 1 and 3 through or in the organic EL element 10 described in the modification example of Embodiment 8. That is, the organic EL layer 3 described in each of the embodiments can have a configuration in which the fluorescent emission layer 34, the exciton generating layer 33, and the block layer 38 are stacked in this order.

[Main Points]

The organic electroluminescent element (organic EL element 10) in accordance with an aspect 1 of the present invention includes at least one layer of an exciton generating layer 33 (exciton generating layer 33, first exciton generating layer 33A, second exciton generating layer 33B) containing at least one type of thermally activated delayed fluorescent material (TADF material) as a host material (TADF host material); and at least one layer of a fluorescent emission layer 34 (fluorescent emission layer 34, first fluorescent emission layer 34A, second fluorescent emission layer 34B) containing at least one type of fluorescent emission material (fluorescent dopant material), the exciton generating layer 33 and the fluorescent emission layer 34 being provided between an anode (e.g., first electrode 2) and a cathode (e.g., second electrode 4).

In general, a luminescent layer is constituted by a two-component system including (i) a host material contributing to transfer of positive holes and electrons and (ii) a luminescent material contributing to light emission. The luminescent material is uniformly dispersed in the host material.

In Patent Literatures 1 and 2 also, a TADF material and a fluorescent emission material which is a fluorescent dopant material (light emission dopant material) that substantially emits light and is a non-TADF material exist together in the same layer.

However, in general, the dopant material is lower in S1 level than the TADF material which is the host material. Therefore, in a case where the TADF material and the fluorescent dopant material which is a non-TADF material exist together, excitons themselves are more likely to be generated in the fluorescent dopant material which is the non-TADF material, and triplet excitons which do not emit light are generated, and accordingly light emission efficiency is lowered.

However, according to studies by the inventors of the present invention, energy transfer (Forster transition) from an S1 level of the TADF material to an S1 level of the fluorescent emission material occurs even in a case where the TADF material which is the host material contributing to transfer of positive holes and electrons does not directly contact with the fluorescent dopant material contributing to light emission.

In view of this, as early described, the exciton generating layer 33 is provided separately from the fluorescent emission layer 34 which contributes to light emission so as to separate functions of a conventional luminescent layer, i.e., functions to emit light and generate excitons. This makes it possible to prevent the TADF material from being mixed with the fluorescent emission material in the same layer. Therefore, according to the configuration, it is possible to provide the organic EL element 10 which can improve light emission efficiency as compared with a conventional technique.

According to the organic electroluminescent element (organic EL element 10) in accordance with an aspect 2 of the present invention, it is possible in the aspect 1 that a shortest distance from an arbitrary location in the exciton generating layer 33 to the fluorescent emission layer 34 is 10 nm or less.

In a case where a distance from a molecule of the TADF material to a molecule of the fluorescent emission material is 10 nm or less, Forster transition surely occurs and energy transfer efficiency is not impaired.

According to the configuration, distances from molecules of the TADF material at arbitrary locations in the exciton generating layer 33 to molecules of the fluorescent emission material are all 10 nm or less. Therefore, according to the configuration, Forster transition can occur in molecules of all TADF materials in the exciton generating layer 33.

According to the organic electroluminescent element (organic EL element 10) in accordance with an aspect 3 of the present invention, it is possible in the aspect 1 or 2 that an excited singlet level (S1 level) of the thermally activated delayed fluorescent material (TADF material, TADF host material) in the exciton generating layer 33 is equal to or higher than an excited singlet level (S1 level) of the fluorescent emission material (fluorescent dopant material) in the fluorescent emission layer 34 in terms of energy level.

According to the configuration, energy transfer (Forster transition) from the exciton generating layer 33 to the fluorescent emission layer 34 can occur. Moreover, it is possible to prevent energy transfer from the fluorescent emission layer 34 to the exciton generating layer 33. Therefore, it is possible to improve light emission efficiency of the fluorescent emission layer 34.

According to the organic electroluminescent element (organic EL element 10) in accordance with an aspect 4 of the present invention, it is possible in any of the aspects 1 through 3 that a HOMO level of the thermally activated delayed fluorescent material (TADF material, TADF host material) in the exciton generating layer 33 is higher than a HOMO level of the fluorescent emission material (fluorescent dopant material) of the fluorescent emission layer 34, and a LUMO level of the thermally activated delayed fluorescent material in the exciton generating layer 33 is lower than a LUMO level of the fluorescent emission material in the fluorescent emission layer 34.

According to the configuration, positive holes and electrons are more likely to enter the exciton generating layer 33, rather than the fluorescent emission layer 34. This makes it possible to heighten exciton generation probability in the exciton generating layer 33, and accordingly it is possible to improve generation efficiency of singlet excitons. As a result, it is possible to improve light emission efficiency of the fluorescent emission layer 34.

According to the organic electroluminescent element (organic EL element 10) in accordance with an aspect 5 of the present invention, it is possible in any of the aspects 1 through 4 that the exciton generating layer 33 contains two or more types of materials.

According to the configuration, by mixing the two or more types of materials, for example, it is possible to change a carrier mobility of the exciton generating layer 33. For example, in a case where TADF materials having different carrier mobilities are mixed so as to adjust the carrier mobility, it is possible to heighten exciton generation probability in the exciton generating layer 33. As a result, it is possible to improve generation efficiency of singlet excitons, and accordingly light emission efficiency of the fluorescent emission layer 34 can be improved.

According to the organic electroluminescent element (organic EL element 10) in accordance with an aspect 6 of the present invention, it is possible in the aspect 5 that the exciton generating layer 33 contains a material (non-TADF material) different from the thermally activated delayed fluorescent material (TADF material, TADF host material); and an excited singlet level (S1 level) and an excited triplet level (T1 level) of each of all materials which are contained in the exciton generating layer 33 and are different from the thermally activated delayed fluorescent material (TADF material, TADF host material) are (i) higher than respective excited singlet level (S1 level) and excited triplet level (T1 level) of the fluorescent emission material (fluorescent dopant material) and (ii) higher than respective excited singlet level (S1 level) and excited triplet level (T1 level) of the thermally activated delayed fluorescent material (TADF material, TADF host material) in the exciton generating layer 33.

According to the aspect of the present invention, the exciton generating layer 33 is provided separately from the fluorescent emission layer 34 which contributes to light emission, and this makes it possible to improve light emission efficiency as compared with a conventional technique. Therefore, the exciton generating layer 33 can contain a material (non-TADF material) different from the thermally activated delayed fluorescent material (TADF material, TADF host material).

According to the configuration, in a case where the non-TADF material is contained in the exciton generating layer 33, it is possible to prevent energy from being transferred to the non-TADF material.

According to the organic electroluminescent element (organic EL element 10) in accordance with an aspect 7 of the present invention, it is possible in any of the aspects 1 through 5 that the fluorescent emission layer 34 contains two or more types of materials.

According to the configuration, by mixing the two or more types of materials, for example, it is possible to change a carrier mobility from the fluorescent emission layer 34 to the exciton generating layer 33.

For example, in a case where an electron transferable material or a positive hole transferable material is mixed with the fluorescent emission material, it is possible to heighten electron transferability or positive hole transferability from the fluorescent emission layer 34 to the exciton generating layer 33. As a result, it is possible to heighten exciton generation probability in the exciton generating layer 33, and accordingly light emission efficiency of the fluorescent emission layer 34 can be improved.

According to the organic electroluminescent element (organic EL element 10) in accordance with an aspect 8 of the present invention, it is possible in the aspect 7 that the fluorescent emission layer 34 contains a material (e.g., host material) different from the fluorescent emission material (fluorescent dopant material); and an excited singlet level (S1 level) and an excited triplet level (T1 level) of each of all materials which are contained in the fluorescent emission layer 34 and are different from the fluorescent emission material (fluorescent dopant material) are (i) higher than respective excited singlet level (S1 level) and excited triplet level (T1 level) of the fluorescent emission material (fluorescent dopant material) and (ii) higher than respective excited singlet level (S1 level) and excited triplet level (T1 level) of the thermally activated delayed fluorescent material (TADF material, TADF host material) in the exciton generating layer 33.

According to the aspect of the present invention, the exciton generating layer 33 is provided separately from the fluorescent emission layer 34 which contributes to light emission, and this makes it possible to improve light emission efficiency as compared with a conventional technique. Therefore, the fluorescent emission layer 34 can contain a material (e.g., host material) different from the fluorescent emission material (fluorescent dopant material).

According to the configuration, in a case where a material different from the fluorescent emission material (fluorescent dopant material) is contained in the fluorescent emission layer 34, it is possible to prevent energy from being transferred to the material different from the fluorescent emission material (fluorescent dopant material).

According to the organic electroluminescent element (organic EL element 10) in accordance with an aspect 9 of the present invention, it is possible in any of the aspects 1 through 8 that the fluorescent emission material contained in the fluorescent emission layer 34 is a thermally activated delayed fluorescent material (TADF material, TADF dopant material).

According to the configuration, the TADF material (TADF dopant material) is used as the fluorescent emission material, and this allows a part of the TADF material in the fluorescent emission layer 34 to be directly excited and accordingly emit light. This makes it possible to improve light emission efficiency.

Note that, even in a case where the TADF material is used as the fluorescent emission material (TADF dopant material), it is possible to prevent the TADF dopant material from generating excitons by, for example, adjusting a carrier mobility, provided that the exciton generating layer 33 and the fluorescent emission layer 34 are separated (i.e., those layers are independently provided) as above described.

According to the organic electroluminescent element (organic EL element 10) in accordance with an aspect 10 of the present invention, it is possible in any of the aspects 1 through 9 that the exciton generating layer 33 is laminated so as to be closer to an anode side (e.g., first electrode 2 side) than the fluorescent emission layer 34 is.

The exciton generating layer 33 is preferably provided at a location at which carriers (positive holes and electrons) recombine. This configuration is suitable for a case where electron transferability is higher than positive hole transferability. That is, in a case where electron transferability is higher than positive hole transferability, positive holes and electrons are more likely to recombine at a location on the anode side between two electrodes, i.e., the anode and the cathode, rather than on a cathode side.

Therefore, in such a case, by providing the exciton generating layer 33 so as to be closer to the anode side than the fluorescent emission layer 34 is, it is possible to efficiently generate excitons in the exciton generating layer 33.

According to the organic electroluminescent element (organic EL element 10) in accordance with an aspect 11 of the present invention, it is possible in any of the aspects 1 through 9 that the exciton generating layer 33 is laminated so as to be closer to a cathode side (e.g., second electrode 4 side) than the fluorescent emission layer 34 is.

The exciton generating layer 33 is preferably provided at a location at which carriers (positive holes and electrons) recombine. This configuration is suitable for a case where positive hole transferability is higher than electron transferability. That is, in a case where positive hole transferability is higher than electron transferability, positive holes and electrons are more likely to recombine at a location on the cathode side between two electrodes, i.e., the anode and the cathode, rather than on the anode side.

Therefore, in such a case, by providing the exciton generating layer 33 so as to be closer to the cathode side than the fluorescent emission layer 34 is, it is possible to efficiently generate excitons in the exciton generating layer 33.

According to the organic electroluminescent element (organic EL element 10) in accordance with an aspect 12 of the present invention, it is possible in any of the aspects 1 through 11 that the exciton generating layer 33 and the fluorescent emission layer 34 are adjacently provided; and a film thickness of the exciton generating layer 33 is 10 nm or less.

In a case where a distance from a molecule of the TADF material to a molecule of the fluorescent emission material is 10 nm or less, Forster transition surely occurs and energy transfer efficiency is not impaired.

In a case where the exciton generating layer 33 and the fluorescent emission layer 34 are adjacently provided and the film thickness of the exciton generating layer 33 is 10 nm or less, it is possible to set the distance to 10 nm or less, which distance is a distance from a molecule of a TADF material in the exciton generating layer 33 which material is farthest from a fluorescent emission material (i.e., a molecule of a TADF material located in a surface of the exciton generating layer 33 which surface is opposite to the fluorescent emission layer 34) to a molecule of a fluorescent emission material of the fluorescent emission layer 34 which material is nearest to a TADF material (i.e., a molecule of a fluorescent emission material located in a surface of the fluorescent emission layer 34 which surface is on the exciton generating layer 33 side). From this, according to the configuration, the Forster transition occurs even in the molecule of the TADF material located in the surface of the exciton generating layer 33 which surface is opposite to the fluorescent emission layer 34. Therefore, according to the configuration, it is possible to cause the Forster transition in molecules of all TADF materials in the exciton generating layer 33.

According to the organic electroluminescent element (organic EL element 10) in accordance with an aspect 13 of the present invention, it is possible in any of the aspects 1 through 9 that a plurality of fluorescent emission layers 34, each of which is the fluorescent emission layer 34, are provided between the anode and the cathode.

By thus providing the plurality of fluorescent emission layers 34, it is possible to improve light emission efficiency.

According to the organic electroluminescent element (organic EL element 10) in accordance with an aspect 14 of the present invention, it is possible in the aspect 13 that the plurality of fluorescent emission layers 34 are laminated so as to sandwich the exciton generating layer 33.

Energy transfer from the exciton generating layer 33 can occur evenly from the anode side and the cathode side of the exciton generating layer 33. Therefore, in a case where the plurality of fluorescent emission layers 34 are laminated so as to sandwich the exciton generating layer 33, energy transfer to the fluorescent emission material can occur without leakage, and this allows improvement in light emission efficiency.

According to the organic electroluminescent element (organic EL element 10) in accordance with an aspect 15 of the present invention, it is possible in the aspect 14 that fluorescent emission layers 34 which sandwich the exciton generating layer 33 are made of different materials.

According to the configuration, the fluorescent emission layers 34 which sandwich the exciton generating layer 33 are made of different materials, and this makes it possible to adjust a carrier mobility or adjust an emitted light color.

According to the organic electroluminescent element (organic EL element 10) in accordance with an aspect 16 of the present invention, it is possible in the aspect 14 or 15 that the exciton generating layer 33 and the fluorescent emission layers 34 sandwiching the exciton generating layer 33 are adjacently laminated, and the film thickness of the exciton generating layer 33 is 20 nm or less.

According to the configuration, it is possible that a distance between a molecule of the TADF material in the exciton generating layer 33 and a molecule of the fluorescent emission material (fluorescent dopant material) in the fluorescent emission layer 34 that is nearer to any of the first fluorescent emission layer 34A and the second fluorescent emission layer 34B can be set to 10 nm or less. Therefore, according to the configuration, Forster transition can occur in molecules of all TADF materials in the exciton generating layer 33. Moreover, energy transfer efficiency is not impaired.

The organic electroluminescent element (organic EL element 10) in accordance with an aspect 17 of the present invention can further includes, in any of the aspects 1 through 15, a block layer 38 (block layer 38, first block layer 38A, second block layer 38B) provided between the anode and the cathode, the exciton generating layer 33, the fluorescent emission layer 34, and the block layer 38 being stacked in this order, and the fluorescent emission layer 34 and the block layer 38 being adjacently laminated.

According to the configuration, it is possible to prevent penetration of carriers (positive holes, electrons) and excitons by the block layer 38. Therefore, according to the configuration, even in a case where a thickness of the fluorescent emission layer 34 is small, it is possible to prevent energy from being transferred from the exciton generating layer 33 beyond the fluorescent emission layer 34, and accordingly light emission efficiency can be improved.

According to the organic electroluminescent element (organic EL element 10) in accordance with an aspect 18 of the present invention, it is possible in the aspect 17 that a thickness of the fluorescent emission layer 34 is smaller than 10 nm.

The above configuration is particularly effective in a case where the thickness of the fluorescent emission layer 34 is smaller than 10 nm. In a case where the thickness of the fluorescent emission layer 34 is smaller than 10 nm, energy may be transferred from the exciton generating layer 33 to the outer side beyond the fluorescent emission layer 34, unless the block layer 38 is provided. However, by providing the block layer 38, it is possible to prevent such energy transfer.

According to the organic electroluminescent element (organic EL element 10) in accordance with an aspect 19 of the present invention, it is possible in the aspect 18 that a total thickness of the fluorescent emission layer 34 and the block layer 38 which are adjacent to each other is 10 nm or more.

According to the configuration, it is possible to further surely prevent decrease in light emission efficiency due to energy transfer from the exciton generating layer 33 to the outer side beyond the fluorescent emission layer 34.

According to the organic electroluminescent element (organic EL element 10) in accordance with an aspect 20 of the present invention, it is possible in any of the aspects 17 through 19 that an excited singlet level (S1 level) and an excited triplet level (T1 level) of each of all materials which are contained in the block layer 38 are (i) higher than respective excited singlet level (S1 level) and excited triplet level (T1 level) of the fluorescent emission material in the adjacent fluorescent emission layer 34 and (ii) higher than respective excited singlet level (S1 level) and excited triplet level (T1 level) of the thermally activated delayed fluorescent material (TADF material, TADF host material) in the exciton generating layer 33.

According to the configuration, it is possible to prevent energy transfer from the fluorescent emission layer 34 and the exciton generating layer 33 to the block layer 38.

According to the organic electroluminescent element (organic EL element 10) in accordance with an aspect 21 of the present invention, it is possible in any of the aspects 17 through 20 that a HOMO level of each of all materials in the block layer 38 is lower than a HOMO level of the fluorescent emission material in the adjacent fluorescent emission layer 34.

According to the configuration, positive holes more likely to enter the fluorescent emission layer 34 rather than the block layer 38, and it is therefore possible to prevent leakage of positive holes. Therefore, according to the configuration, exciton generation probability in the exciton generating layer 33 is improved, and accordingly light emission efficiency can be improved.

According to the organic electroluminescent element (organic EL element 10) in accordance with an aspect 22 of the present invention, it is possible in any of the aspects 17 through 21 that a LUMO level of each of all materials in the block layer 38 is higher than a LUMO level of the fluorescent emission material in the adjacent fluorescent emission layer 34.

According to the configuration, electrons are more likely to enter the fluorescent emission layer 34 rather than the block layer 38, and it is therefore possible to prevent leakage of electrons. Therefore, according to the configuration, exciton generation probability in the exciton generating layer 33 is improved, and accordingly light emission efficiency can be improved.

According to the organic electroluminescent element (organic EL element 10) in accordance with an aspect 23 of the present invention, it is possible in any of the aspects 1 through 9 that a plurality of exciton generating layers 33 each of which is the exciton generating layer 33 are provided between the anode and the cathode.

By thus providing the plurality of exciton generating layers 33, it is possible to improve light emission efficiency.

According to the organic electroluminescent element (organic EL element 10) in accordance with an aspect 24 of the present invention, it is possible in the aspect 23 that the plurality of exciton generating layers 33 are laminated such that the fluorescent emission layer 34 is sandwiched between any two of the plurality of exciton generating layers.

According to the configuration, carriers are more likely to recombine in the exciton generating layer 33 even in a case where the organic EL element 10 is driven under a different electric current condition, and light emission efficiency is improved.

According to the organic electroluminescent element (organic EL element 10) in accordance with an aspect 25 of the present invention, it is possible in the aspect 24 that the exciton generating layers 33 sandwiching the fluorescent emission layer 34 contain different thermally activated delayed fluorescent materials (TADF material, TADF host material).

According to the configuration, it is possible to make carrier mobilities of the exciton generating layers 33 different. Therefore, according to the configuration, in a case where the organic EL element 10 is driven by changing an electric current density, it is possible to adjust a location, at which excitons are generated, in accordance with the electric current density to be changed. From this, carriers are more likely to recombine in the exciton generating layer 33, and accordingly light emission efficiency is improved.

According to the organic electroluminescent element (organic EL element 10) in accordance with an aspect 26 of the present invention, it is possible in any of the aspects 24 and 25 that a film thickness of the fluorescent emission layer 34 is 10 nm or less.

According to the configuration, the fluorescent emission layer 34 is sandwiched between the exciton generating layers 33. From this, even in a case where the thickness of the fluorescent emission layer 34 is small, energy is less likely to be transferred beyond the fluorescent emission layer 34 to the hole transfer layer 32 and the electron transfer layer 35 which are located on outer sides. Therefore, the organic EL element 10 is suitable for a case where the thickness of the fluorescent emission layer 34 is 10 nm or less.

According to the organic electroluminescent element (organic EL element 10) in accordance with an aspect 27 of the present invention, it is possible in any of the aspects 24 through 26 that the fluorescent emission layer 34 and the exciton generating layers 33 sandwiching the fluorescent emission layer 34 are adjacently laminated and a thickness of each of the exciton generating layers 33 sandwiching the fluorescent emission layer 34 is 10 nm or less.

According to the configuration, Forster transition surely occurs and energy transfer efficiency is not impaired.

It is possible that the organic electroluminescent element (organic EL element 10) in accordance with an aspect 28 of the present invention further includes, in any of the aspects 1 through 12 and 23 through 26, a block layer 38 (block layer 38, first block layer 38A, second block layer 38B) provided between the anode and the cathode, the fluorescent emission layer 34, the exciton generating layer 33, and the block layer 38 being stacked in this order, and the exciton generating layer 33 and the block layer 38 being adjacently laminated.

According to the configuration, it is possible to prevent penetration of carriers (positive holes, electrons) and excitons by the block layer 38. Therefore, according to the configuration, it is possible to prevent energy from being transferred from the exciton generating layer 33 to a layer other than the fluorescent emission layer 34, and accordingly light emission efficiency can be improved.

According to the organic electroluminescent element (organic EL element 10) in accordance with an aspect 29 of the present invention, it is possible in the aspect 28 that a thickness of the block layer 38 is 10 nm or more.

According to the configuration, it is possible to further surely prevent decrease in light emission efficiency due to energy transfer from the exciton generating layer 33 to a layer other than the fluorescent emission layer 34.

According to the organic electroluminescent element (organic EL element 10) in accordance with an aspect 30 of the present invention, it is possible in the aspect 28 or 29 that an excited singlet level (S1 level) and an excited triplet level (T1 level) of each of all materials in the block layer 38 are (i) higher than respective excited singlet level (S1 level) and excited triplet level (T1 level) of the thermally activated delayed fluorescent material (TADF material, TADF host material) in the adjacent exciton generating layer 33 and (ii) higher than respective excited singlet level (S1 level) and excited triplet level (T1 level) of the fluorescent emission material (fluorescent dopant material) in the fluorescent emission layer 34.

According to the configuration, it is possible to prevent energy transfer from the exciton generating layer 33 and the fluorescent emission layer 34 to the block layer 38.

According to the organic electroluminescent element (organic EL element 10) in accordance with an aspect 31 of the present invention, it is possible in any of the aspects 28 through 30 that a HOMO level of each of all materials in the block layer 38 is lower than a HOMO level of the thermally activated delayed fluorescent material (TADF material, TADF host material) in the adjacent exciton generating layer 33.

According to the configuration, positive holes are more likely to enter the fluorescent emission layer 34 rather than the block layer 38, and it is therefore possible to prevent leakage of positive holes. From this, exciton generation probability in the exciton generating layer 33 is improved, and accordingly light emission efficiency can be improved.

According to the organic electroluminescent element (organic EL element 10) in accordance with an aspect 32 of the present invention, it is possible in any of the aspects 28 through 31 that a LUMO level of each of all materials in the block layer 38 is higher than a LUMO level of the thermally activated delayed fluorescent material (TADF material, TADF host material) in the adjacent exciton generating layer 33.

According to the configuration, electrons are more likely to enter the fluorescent emission layer 34 rather than the block layer 38, and it is therefore possible to prevent leakage of electrons. From this, exciton generation probability in the exciton generating layer 33 is improved, and accordingly light emission efficiency can be improved.

According to the organic electroluminescent element (organic EL element 10) in accordance with an aspect 33 of the present invention, it is possible in the aspects 1 through 11, 13 through 15, 17 through 26, and 28 through 32 that at least one intermediate layer 37 is provided between the exciton generating layer 33 and the fluorescent emission layer 34.

According to the configuration, the exciton generating layer 33 and the fluorescent emission layer 34 are not consecutively laminated, and a layer other than the exciton generating layer 33 and the fluorescent emission layer 34 is provided between the exciton generating layer and the fluorescent emission layer 34 as the intermediate layer 37.

Therefore, according to the configuration, it is possible to prevent excitons from being directly generated in the fluorescent dopant made of a non-TADF material in the fluorescent emission layer 34 because a carrier recombination region extends to an outer side of the exciton generating layer 33 when an electric current density is increased in order to cause the organic EL element 10 to emit light at a high luminance. Therefore, according to the configuration, it is possible to improve light emission efficiency.

According to the organic electroluminescent element (organic EL element 10) in accordance with an aspect 34 of the present invention, it is possible in the aspect 14 or 15 that the plurality of fluorescent emission layers 34 include a first fluorescent emission layer 34A and a second fluorescent emission layer 34B, and at least one intermediate layer 37 is provided at at least one of locations between the first fluorescent emission layer 34A and the exciton generating layer 33 and between the second fluorescent emission layer 34B and the exciton generating layer 33.

According to the configuration, a layer other than the exciton generating layer 33 and the fluorescent emission layers 34 (first fluorescent emission layer 34A, second fluorescent emission layer 34B) is provided at at least one of locations between the exciton generating layer 33 and the first fluorescent emission layer 34A and between the exciton generating layer 33 and the second fluorescent emission layer 34B as the intermediate layer 37 (first intermediate layer 37A or second intermediate layer 37B).

Therefore, according to the configuration, it is possible to prevent excitons from being directly generated in the fluorescent dopant made of a non-TADF material in each of the fluorescent emission layers 34 because a carrier recombination region extends to an outer side of the exciton generating layer 33 when an electric current density is increased in order to cause the organic EL element 10 to emit light at a high luminance. Therefore, according to the configuration, it is possible to improve light emission efficiency.

According to the organic electroluminescent element (organic EL element 10) in accordance with an aspect 35 of the present invention, it is possible in any of the aspects 24 through 26 that the plurality of exciton generating layers 33 include a first exciton generating layer 33A and a second exciton generating layer 33B, and at least one intermediate layer 37 is provided at at least one of locations between the first exciton generating layer 33A and the fluorescent emission layer 34 and between the second exciton generating layer 33B and the fluorescent emission layer 34.

According to the configuration, a layer other than the fluorescent emission layer 34 and the exciton generating layers 33 (first exciton generating layer 33A, second exciton generating layer 33B) is provided at at least one of locations between the fluorescent emission layer 34 and the first exciton generating layer 33A and between the fluorescent emission layer 34 and the second exciton generating layer 33B as the intermediate layer 37 (first intermediate layer 37A or second intermediate layer 37B).

Therefore, according to the configuration, it is possible to prevent excitons from being directly generated in the fluorescent dopant made of a non-TADF material in each of the fluorescent emission layers 34 because a carrier recombination region extends to an outer side of the exciton generating layer 33 when an electric current density is increased in order to cause the organic EL element 10 to emit light at a high luminance. Therefore, according to the configuration, it is possible to improve light emission efficiency.

According to the organic electroluminescent element (organic EL element 10) in accordance with an aspect 36 of the present invention, it is possible in any of the aspects 24 through 26 that the plurality of exciton generating layers 33 include a first exciton generating layer 33A and a second exciton generating layer 33B, at least one first intermediate layer 37A is provided between the first exciton generating layer 33A and the fluorescent emission layer 34, and at least one second intermediate layer 37B is provided between the second exciton generating layer 33B and the fluorescent emission layer 34.

According to the configuration, the first exciton generating layer 33A and the fluorescent emission layer 34 are not consecutively laminated and a layer other than the fluorescent emission layer 34 and the exciton generating layers 33 (first exciton generating layer 33A, second exciton generating layer 33B) is provided at each of locations between the fluorescent emission layer 34 and the first exciton generating layer 33A and between the fluorescent emission layer 34 and the second exciton generating layer 33B as the intermediate layer 37 (first intermediate layer 37A or second intermediate layer 37B).

Therefore, according to the configuration, it is possible to prevent excitons from being directly generated in the fluorescent dopant made of a non-TADF material in each of the fluorescent emission layers 34 because a carrier recombination region extends to an outer side of the exciton generating layer 33 when an electric current density is increased in order to cause the organic EL element 10 to emit light at a high luminance. Therefore, according to the configuration, it is possible to improve light emission efficiency.

According to the organic electroluminescent element (organic EL element 10) in accordance with an aspect 37 of the present invention, it is possible in any of the aspects 33 through 36 that a total thickness of the exciton generating layer and the at least one intermediate layer which are adjacent to each other is 10 nm or less.

According to the configuration, it is possible to set a shortest distance from an arbitrary location in the exciton generating layer 33 to the fluorescent emission layer 34 to be 10 nm or less. Therefore, according to the configuration, Forster transition can occur in molecules of all TADF materials in the exciton generating layer 33. Moreover, energy transfer efficiency is not impaired.

According to the organic electroluminescent element (organic EL element 10) in accordance with an aspect 38 of the present invention, it is possible in the aspect 14 or 15 that the plurality of fluorescent emission layers 34 include a first fluorescent emission layer 34A and a second fluorescent emission layer 34B, and at least one first intermediate layer 37A is provided between the first fluorescent emission layer 34A and the exciton generating layer 33 and at least one second intermediate layer 37B is provided between the second fluorescent emission layer 34B and the exciton generating layer 33.

According to the configuration, the first fluorescent emission layer 34A, the exciton generating layer 33, and the second fluorescent emission layer 34B are not consecutively laminated, and a layer other than the exciton generating layer 33 and the fluorescent emission layers 34 (first fluorescent emission layer 34A, second fluorescent emission layer 34B) is provided at each of locations between the exciton generating layer 33 and the first fluorescent emission layer 34A and between the exciton generating layer 33 and the second fluorescent emission layer 34B as the intermediate layer 37 (first intermediate layer 37A or second intermediate layer 37B).

Therefore, according to the configuration, it is possible to prevent excitons from being directly generated in the fluorescent dopant made of a non-TADF material in each of the fluorescent emission layers 34 because a carrier recombination region extends to an outer side of the exciton generating layer 33 when an electric current density is increased in order to cause the organic EL element 10 to emit light at a high luminance. Therefore, according to the configuration, it is possible to improve light emission efficiency.

According to the organic electroluminescent element (organic EL element 10) in accordance with an aspect 39 of the present invention, it is possible in the aspect 38 that a total thickness of the at least one first intermediate layer 37A, the exciton generating layer 33, and the at least one second intermediate layer 37B which are adjacently provided is 20 nm or less.

According to the configuration, it is possible that a distance between a molecule of the TADF material in the exciton generating layer 33 and a molecule of the fluorescent emission material (fluorescent dopant material) in closer one of the first fluorescent emission layer 34A and the second fluorescent emission layer 34B can be set to 10 nm or less. Therefore, according to the configuration, Forster transition can occur in molecules of all TADF materials in the exciton generating layer 33. Moreover, energy transfer efficiency is not impaired.

According to the organic electroluminescent element (organic EL element 10) in accordance with an aspect 40 of the present invention, it is possible in any of the aspects 33 through 39 that a HOMO level of each of materials in the intermediate layer 37 is lower than a HOMO level of the thermally activated delayed fluorescent material (TADF material, TADF host material) in the exciton generating layer 33, and a LUMO level of each of all materials in the intermediate layer 37 is higher than a LUMO level of the thermally activated delayed fluorescent material in the exciton generating layer 33.

According to the configuration, positive holes and electrons are more likely to enter the exciton generating layer 33 rather than the intermediate layer 37. Therefore, according to the configuration, exciton generation probability in the exciton generating layer 33 is improved, and accordingly light emission efficiency can be improved.

According to the organic electroluminescent element (organic EL element 10) in accordance with an aspect 41 of the present invention, it is possible in any of the aspects 33 through 40 that a HOMO level of each of all materials in the intermediate layer 37 is higher than a HOMO level H of the fluorescent emission material in the fluorescent emission layer 34, and a LUMO level of each of all materials in the intermediate layer 37 is lower than a LUMO level of the fluorescent emission material in the fluorescent emission layer 34.

According to the configuration, positive holes and electrons are more likely to enter the intermediate layer 37 rather than the fluorescent emission layer 34. Therefore, according to the configuration, exciton generation probability in the exciton generating layer 33 is improved, and accordingly light emission efficiency can be improved.

According to the organic electroluminescent element (organic EL element 10) in accordance with an aspect 42 of the present invention, it is possible in any of the aspects 33 through 41 that an excited singlet level (S1 level) and an excited triplet level (T1 level) of each of all materials in the intermediate layer 37 are higher than respective excited singlet level (S1 level) and excited triplet level (T1 level) of the fluorescent emission material in the fluorescent emission layer.

According to the configuration, it is possible to prevent energy from being transferred to the material of the intermediate layer 37.

According to the organic electroluminescent element (organic EL element 10) in accordance with an aspect 43 of the present invention, it is possible in any of the aspects 33 through 42 that an excited singlet level (S1 level) and an excited triplet level (T1 level) of each of all materials in the intermediate layer 37 are higher than respective excited singlet level (S1 level) and excited triplet level (T1 level) of the thermally activated delayed fluorescent material in the exciton generating layer 33.

For example, as an example of the organic electroluminescent element (organic EL element 10) in accordance with an aspect 43 of the present invention, it is possible in any of the aspects 33 through 41 that an excited singlet level (S1 level) and an excited triplet level (T1 level) of each of all materials in the intermediate layer 37 in the organic electroluminescent element (organic EL element 10) are (i) higher than respective excited singlet level (S1 level) and excited triplet level (T1 level) of the fluorescent emission material in the fluorescent emission layer and (ii) higher than respective excited singlet level (S1 level) and excited triplet level (T1 level) of the thermally activated delayed fluorescent material in the exciton generating layer 33.

According to the configuration, it is possible to prevent energy from being transferred to the material of the intermediate layer 37.

The method for manufacturing the organic electroluminescent element (organic EL element 10) in accordance with an aspect 44 of the present invention includes the steps of forming an organic layer (organic EL layer 3) between an anode (e.g., first electrode 2) and a cathode (e.g., second electrode 4), the step of forming the organic layer including: forming an exciton generating layer 33 which contains at least one type of thermally activated delayed fluorescent material (TADF material) as a host material, and forming a fluorescent emission layer 34 which contains at least one type of fluorescent emission material (fluorescent dopant material).

According to the method, as early described, the exciton generating layer 33 is provided separately from the fluorescent emission layer 34 which contributes to light emission, and this makes it possible to prevent the TADF material from being mixed with the fluorescent emission material in the same layer. Therefore, according to the method, it is possible to provide the method for manufacturing the organic EL element 10 which can improve light emission efficiency as compared with a conventional technique.

The light emission method in accordance with an aspect 45 of the present invention is a method in which light emission is caused by transferring excitons, which have been generated in an exciton generating layer 33 containing a thermally activated delayed fluorescent material (TADF material, TADF host material), to a fluorescent emission material (fluorescent dopant material) in a fluorescent emission layer 34 by Forster transition, the fluorescent emission layer 34 being provided separately from the exciton generating layer 33.

As early described, according to the study by the inventors of the present invention, Forster transition occurs even in a case where a TADF material which is a host material contributing to transfer of positive holes and electrons is not directly making contact with a fluorescent dopant material which contributes to light emission.

In view of this, it is possible to provide the light emission method in which light emission efficiency is higher than that of a conventional technique by (i) separating functions of light emission and exciton generation which have been carried out in a conventional luminescent layer, (ii) providing the exciton generating layer 33 separately from the fluorescent emission layer 34 which contributes to light emission, and (iii) transferring, by Forster transition, excitons which have been generated in the exciton generating layer 33 containing a TADF material (TADF host material) to the fluorescent dopant material of the fluorescent emission layer 34 which is provided separately from the exciton generating layer 33 so as to cause light emission.

The present invention is not limited to the embodiments, but can be altered by a skilled person in the art within the scope of the claims. An embodiment derived from a proper combination of technical means each disclosed in a different embodiment is also encompassed in the technical scope of the present invention. Further, it is possible to form a new technical feature by combining the technical means disclosed in the respective embodiments.

INDUSTRIAL APPLICABILITY

The present invention is applicable to various devices including an organic EL element and can be used in, for example, a display device such as a television.

REFERENCE SIGNS LIST

1: Substrate
2: First electrode
3: Organic EL layer (organic layer)
4: Second electrode
10: Organic EL element
21: Non-light-transmitting electrode
22: Light-transmitting electrode
31: Hole injection layer
32: Hole transfer layer
33: Exciton generating layer
33A: First exciton generating layer (exciton generating layer)
33B: Second exciton generating layer (exciton generating layer)
33a: Molecule of TADF host material
34: Fluorescent emission layer
34A: First fluorescent emission layer (fluorescent emission layer)
34B: Second fluorescent emission layer (fluorescent emission layer)
34C: Third fluorescent emission layer (fluorescent emission layer)
34a: Molecule of fluorescent dopant material
35: Electron transfer layer
36: Electron injection layer
37: Intermediate layer
37A: First intermediate layer (intermediate layer)
37B: Second intermediate layer (intermediate layer)
38: Block layer
38A: First block layer (block layer)
38B: Second block layer (block layer)

The invention claimed is:

1. An organic electroluminescent element comprising:
    at least one layer of an exciton generating layer containing at least one type of thermally activated delayed fluorescent material as a host material; and
    at least one layer of a fluorescent emission layer containing at least one type of fluorescent emission material, wherein
    the exciton generating layer and the fluorescent emission layer are between an anode and a cathode, and
    the exciton generating layer is laminated to be closer to an anode side than is the fluorescent emission layer.

2. The organic electroluminescent element as set forth in claim 1, wherein:
    a shortest distance from an arbitrary location in the exciton generating layer to the fluorescent emission layer is 10 nm or less.

3. The organic electroluminescent element as set forth in claim 1, wherein:
    an excited singlet level of the thermally activated delayed fluorescent material in the exciton generating layer is equal to or higher than an excited singlet level of the fluorescent emission material in the fluorescent emission layer in terms of energy level.

4. The organic electroluminescent element as set forth in claim 1, wherein:
    a HOMO level of the thermally activated delayed fluorescent material in the exciton generating layer is higher than a HOMO level of the fluorescent emission material of the fluorescent emission layer, and a LUMO level of the thermally activated delayed fluorescent material in the exciton generating layer is lower than a LUMO level of the fluorescent emission material in the fluorescent emission layer.

5. The organic electroluminescent element as set forth in claim 1, wherein:
    the fluorescent emission material contained in the fluorescent emission layer is a thermally activated delayed fluorescent material.

6. The organic electroluminescent element as set forth in claim 1, wherein:
    a plurality of fluorescent emission layers are provided between the anode and the cathode, each of the plurality of fluorescent emission layers being said fluorescent emission layer.

7. The organic electroluminescent element as set forth in claim 6, wherein:
    the plurality of fluorescent emission layers are laminated such that the exciton generating layer is sandwiched between any two of the plurality of fluorescent emission layers.

8. The organic electroluminescent element as set forth in claim 7, wherein:
- the plurality of fluorescent emission layers include a first fluorescent emission layer and a second fluorescent emission layer;
- at least one layer of a first intermediate layer is provided between the first fluorescent emission layer and the exciton generating layer; and
- at least one layer of a second intermediate layer is provided between the second fluorescent emission layer and the exciton generating layer.

9. The organic electroluminescent element as set forth in claim 1, further comprising:
- a block layer provided between the anode and the cathode,
- the exciton generating layer, the fluorescent emission layer, and the block layer being stacked in this order, and
- the fluorescent emission layer and the block layer being adjacently laminated.

10. The organic electroluminescent element as set forth in claim 9, wherein:
- an excited singlet level and an excited triplet level of each of all materials in the block layer are (i) higher than respective excited singlet level and excited triplet level of the fluorescent emission material in the fluorescent emission layer that is adjacent to the block layer and (ii) higher than respective excited singlet level and excited triplet level of the thermally activated delayed fluorescent material in the exciton generating layer.

11. The organic electroluminescent element as set forth in claim 1, wherein:
- a plurality of exciton generating layers are provided between the anode and the cathode, each of the plurality of exciton generating layers being said exciton generating layer.

12. The organic electroluminescent element as set forth in claim 11, wherein:
- the plurality of exciton generating layers are laminated such that the fluorescent emission layer is sandwiched between any two of the plurality of exciton generating layers.

13. The organic electroluminescent element as set forth in claim 1, further comprising:
- a block layer provided between the anode and the cathode,
- the fluorescent emission layer, the exciton generating layer, and the block layer being stacked in this order, and
- the exciton generating layer and the block layer being adjacently laminated.

14. The organic electroluminescent element as set forth in claim 13, wherein:
- an excited singlet level and an excited triplet level of each of all materials in the block layer are (i) higher than respective excited singlet level and excited triplet level of the thermally activated delayed fluorescent material in the exciton generating layer that is adjacent to the block layer and (ii) higher than respective excited singlet level and excited triplet level of the fluorescent emission material in the fluorescent emission layer.

15. The organic electroluminescent element as set forth in claim 1, wherein:
- at least one layer of an intermediate layer is provided between the exciton generating layer and the fluorescent emission layer.

16. The organic electroluminescent element as set forth in claim 15, wherein:
- an excited singlet level and an excited triplet level of each of all materials in the intermediate layer are (i) higher than respective excited singlet level and excited triplet level of the fluorescent emission material in the fluorescent emission layer and (ii) higher than respective excited singlet level and excited triplet level of the thermally activated delayed fluorescent material in the exciton generating layer.

17. The organic electroluminescent element as set forth in claim 1, wherein:
- the exciton generating layer contains a material different from the thermally activated delayed fluorescent material;
- an excited singlet level and an excited triplet level of each of all materials which are contained in the exciton generating layer and are different from the thermally activated delayed fluorescent material are (i) higher than respective excited singlet level and excited triplet level of the fluorescent emission material and (ii) higher than respective excited singlet level and excited triplet level of the thermally activated delayed fluorescent material in the exciton generating layer.

18. The organic electroluminescent element as set forth in claim 1, wherein:
- the fluorescent emission layer contains a material different from the fluorescent emission material;
- an excited singlet level and an excited triplet level of each of all materials other than the fluorescent emission material in the fluorescent emission layer are (i) higher than respective excited singlet level and excited triplet level of the fluorescent emission material and (ii) higher than respective excited singlet level and excited triplet level of the thermally activated delayed fluorescent material in the exciton generating layer.

* * * * *